(12) United States Patent  (10) Patent No.: US 6,897,425 B2
Osada  (45) Date of Patent: May 24, 2005

(54) METHOD OF PROCESSING AN IMAGE SIGNAL WITH THE RESULT FROM DECISION ON A CORRELATION CORRECTED

(75) Inventor: Masaru Osada, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 664 days.

(21) Appl. No.: 10/020,919

(22) Filed: Dec. 19, 2001

(65) Prior Publication Data

US 2002/0113195 A1 Aug. 22, 2002

(30) Foreign Application Priority Data

Dec. 22, 2000 (JP) ........................................ 2000-390131

(51) Int. Cl.$^7$ ............................................. H01L 27/00
(52) U.S. Cl. ..................................... 250/208.1; 348/272
(58) Field of Search .............................. 250/208.1, 226, 250/214 R; 382/162, 164, 260; 348/272, 273, 237, 234

(56) References Cited

U.S. PATENT DOCUMENTS 6,469,290 B1 * 10/2002 Suzuki .................... 250/208.1

FOREIGN PATENT DOCUMENTS

JP  2000-184386 A  6/2000

* cited by examiner

Primary Examiner—Que T. Le
(74) Attorney, Agent, or Firm—Birch, Stewart, Kolasch & Birch, LLP

(57) ABSTRACT

In a digital camera, an image pickup section feeds pixel data to a signal processor that uses green pixel data as high-frequency luminance data. To generate luminance for a subject pixel that is either a red pixel or a blue pixel, the signal processor determines a direction of correlation by using the subject pixel and pixel data identical in color with the subject pixel and adjoining it in horizontal and vertical directions. The signal processor then generates, based on the subject pixel and the pixel data used for the above decision, a color complementary to green as high-frequency luminance data while attaching a flag indicative of the direction of correlation to the pixel data. Further, by comparing flag patterns, the signal processor corrects the above flag and then generates high-frequency luminance data from pixel data positioned in a direction indicated by the flag. This obviates a difference in level between nearby pixels in a direction of length.

19 Claims, 27 Drawing Sheets

Fig. 24

|  | | G | | G | | G | | G | | G |
|---|---|---|---|---|---|---|---|---|---|---|
| LIGHT | (R, G, B) | | R+ | | B+ | | R+ | | B+ | |
| | | G | | G | | G | | G | | G |
| | | | Bh | | Rh | | Bh | | Rh | |
| DARK | (r, g, b) | g | | g | | g | | g | | g |
| | | | r+ | | b+ | | r+ | | b+ | |
| | | g | | g | | g | | g | | g |
| | | | Bh | | Rh | | Bh | | Rh | |
| LIGHT | (R, G, B) | G | | G | | G | | G | | G |
| | | | R+ | | B+ | | R+ | | B+ | |
| | | G | | G | | G | | G | | G |

Fig. 25

|  | | G | | G | | G | | G | | G |
|---|---|---|---|---|---|---|---|---|---|---|
| LIGHT | (R, G, B) | | Rh | | Bh | | Rh | | Bh | |
| | | G | | G | | G | | G | | G |
| | | | Bh | | Rh | | Bh | | Rh | |
| DARK | (r, g, b) | g | | g | | g | | g | | g |
| | | | rh | | bh | | rh | | bh | |
| | | g | | g | | g | | g | | g |
| | | | Bh | | Rh | | Bh | | Rh | |
| LIGHT | (R, G, B) | G | | G | | G | | G | | G |
| | | | Rh | | Bh | | Rh | | Bh | |
| | | G | | G | | G | | G | | G |

METHOD OF PROCESSING AN IMAGE SIGNAL WITH THE RESULT FROM DECISION ON A CORRELATION CORRECTED

BACKGROUND OF THE INVENTION

1. Field of the Invention

The present invention relates to an image signal processing method advantageously applicable to a digital camera, image inputting unit or similar imaging apparatus of the type interpolating pixel data in virtual pixels by using the pixel data of real pixels.

2. Description of the Background Art

In a digital camera, for example, the number of photosensitive cells or pixels bidimensionally arranged on a solid-state image sensor determines the resolution of an image. Resolution increases with an increase in the number of pixels arranged in a limited area available with the image sensor. On the other hand, for a given number of photosensitive cells, the influence of noise, for example, decreases with an increase in the size and therefore sensitivity of the individual photosensitive cell, enhancing image quality. Stated another way, the size of the individual photosensitive cell decreases with an increase in the number of pixels that should be arranged in the limited area. As a result, sensitivity falls due to the decrease in the size of the individual photosensitive cell although the number of pixels and therefore resolution may increase. This limits image quality available with the image sensor.

Japanese patent laid-open publication No. 2000-184386, for example, discloses a signal processing method and a solid-state image sensor addressing the above-stated contradictory demands. Specifically, the image sensor disclosed in the above document includes photosensitive cells shifted from each other by one-half of a pixel pitch in the horizontal and vertical directions in a so-called honeycomb pattern. The honeycomb pattern allows the greatest possible number of pixels to be packed in a limited space. The individual photosensitive cell is provided with a relatively large size and therefore sufficient sensitivity for the number of pixels arranged, thereby protecting image quality from degradation. To use the resulting pixel data more effectively, pixel data are interpolated in virtual pixels where the photosensitive cells are absent, as distinguished from real pixels where the photosensitive cells are present. The real pixels and virtual pixels both are dealt with as pixels in order to further increase resolution. In addition, the frequencies of signal components of luminance data and color data are raised for thereby enhancing image quality.

As for a virtual pixel, the prior art signal processing method described above detects a correlation between pixels in each of the oblique direction and vertical and horizontal directions and then selects one direction in which the degree of correlation is highest. Subsequently, the method interpolates pixel data in the virtual pixel by using pixels positioned in the direction having the highest degree of correlation, thereby improving image quality (adaptive interpolation).

However, the prior art interpolation of virtual pixels is apt to degrade image quality. For example, when a subject includes chromatic and achromatic lines over a particular width, a difference in level occurs in the direction of length due to such a configuration of the subject. Also, when a resolution chart is shot, spurious signals intersecting the wedge-shaped portion of the chart, which is the index of resolution, appears in the resulting image. In addition, discontinuous lines appear in the image.

SUMMARY OF THE INVENTION

It is an object of the present invention to provide a signal processing method capable of protecting image quality from degradation ascribable to the interpolation of virtual pixels.

In accordance with the present invention, an image signal processing method uses a plurality of photosensitive cells each of which is shifted from the geometric center of the adjoining photosensitive cell by half a pitch in at least one of the direction of row and the direction of column for separating incident light representative of a scene into three primary colors and executing photoelectric transduction with separated light. The photosensitive cells are used as real pixels. Image signals output from the photosensitive cell are converted to digital image data. By using the digital image data, interpolation is executed for generating virtual pixels between the real pixels to thereby generate luminance data and chrominance data. When the image data are bidimensionally arranged such that green of the image data appears in a square lattice pattern, a first step obtains red pixel data from the real pixels facing each other in one diagonal direction at both sides of green, and obtains blue pixel data from the real pixels facing each other in the other diagonal direction at both sides of green. When either one of a red real pixel and a blue real pixel is a subject pixel to be dealt with, a second step generates pixel data of a color complementary to green by using a plurality of pixel data surrounding the subject pixel and positioned in the direction of correlation, while making a decision for improving correlation accuracy. A third step generates pixel data to be interpolated in the virtual pixel from pixel data of the same color facing each other in at least one of the horizontal and vertical directions by using the pixel data of the complementary color and green pixel data. A fourth step limits a frequency band in the direction perpendicular to the direction used for the interpolation.

BRIEF DESCRIPTION OF THE DRAWINGS

The objects and features of the present invention will become more apparent from consideration of the following detailed description taken in conjunction with the accompanying drawings in which:

FIG. 24 shows a relation between a thin line included in a scene shot and spaced from adjoining thin lines by a relatively great distance, the colors and signal levels of pixel data, and flags;

FIG. 25 shows portions of FIG. 24 corrected by the vertical/horizontal correlation decision processing added to FIG. 11;

FIG. 26 shows a relation between thin lines included in a scene shot and spaced from each other by a relatively small distance, the colors and signal levels of pixel data, and flags;

FIG. 27 shows portions of FIG. 26 corrected by the vertical/horizontal correction decision processing added to FIG. 11;

FIG. 28 shows the result of comparison and correction of a flag pattern executed in FIG. 8;

DESCRIPTION OF THE PREFERRED EMBODIMENT

Figure 1:
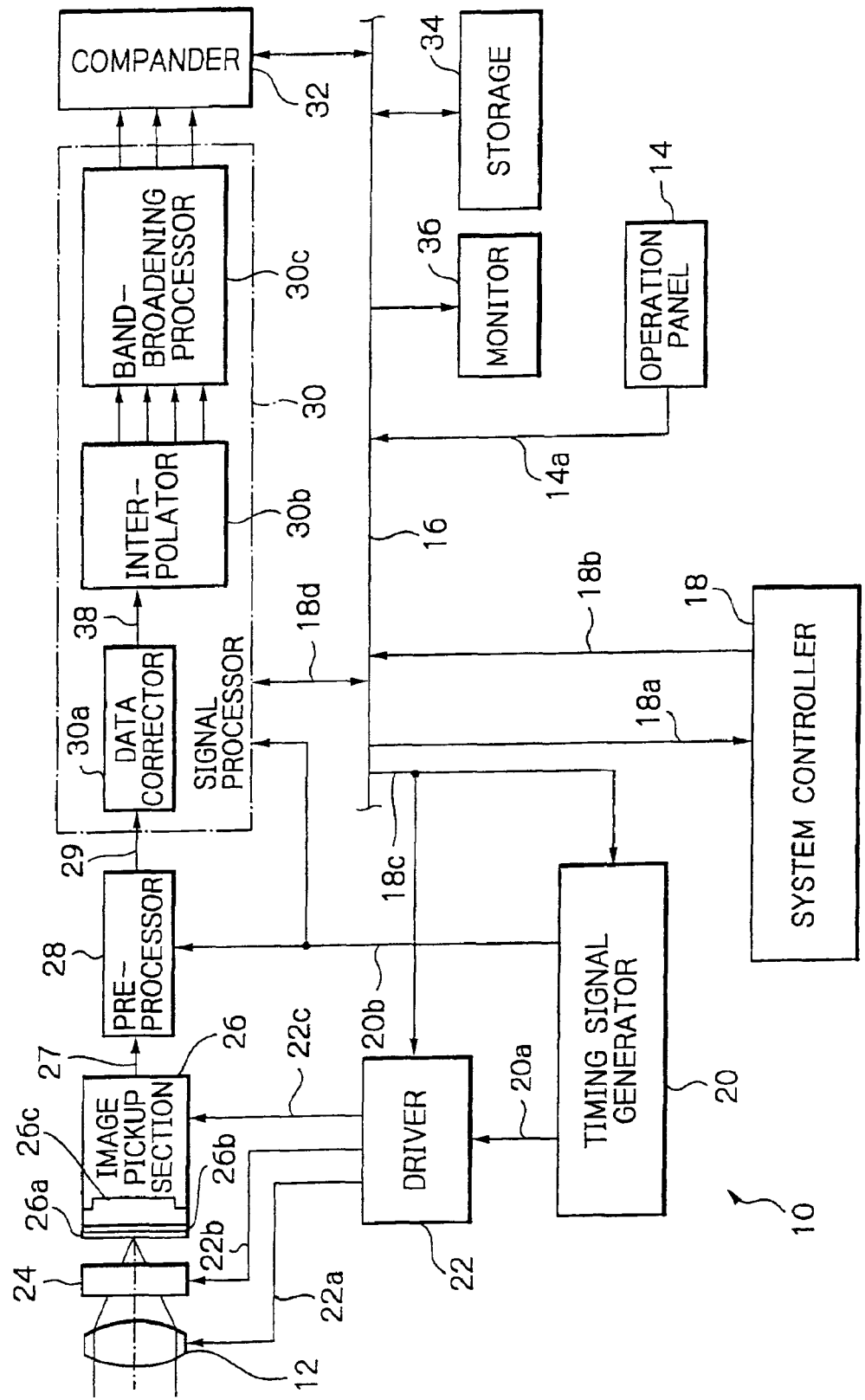
FIG. 1 is a schematic block diagram showing a digital camera to which an image signal processing method embodying the present invention is applied.

Referring to FIG. 1 of the drawings, a digital camera to which the present invention is applied is shown. Part of the digital camera not directly relevant to the understanding of the present invention is not shown nor will be described. As shown, the digital camera, generally 10, includes an optical lens system 12, an operation panel 14, a system controller 18, and a timing signal generator 20. The camera 10 further includes a driver 22, an image pickup section 26, preprocessor 28, a signal processor 30, a compander 32, a storage 34, and a monitor 36.

The optical lens system 12 includes, e.g., a plurality of lenses, a zoom mechanism, and an AF (Automatic Focus) control mechanism although not shown specifically. The zoom mechanism adjusts the positions of the lenses and therefore a view angle in accordance with an operation signal 14a fed from the operation panel 14. The AF control mechanism controls the distance between the camera 10 and a desired subject to thereby focus the former on the latter. The operation signal 14a is input to the system controller 18 through a system bus 16 and a data bus 18a. The system controller 18 feeds control signals 18b to the system bus 16. The control signals 18b are input to the timing signal generator 20 and driver 22 as control signals 18c, as will be described more specifically later. The timing signal generator 20 and driver 22 operate in accordance with the control signals 18c, feeding drive signals 22a to the lens system 12.

The operation panel 14 includes a shutter release button and a monitor although not shown specifically. The operator of the camera 10 can select desired one of various items appearing on the monitor by using a cursor. The operation panel 14 further includes a camera/movie selecting section that allows the operator to select either one of a camera or still picture mode and a movie picture mode. The camera/movie selecting section outputs a particular signal, not shown, representative of the camera mode or the movie mode.

The system controller 18 includes, e.g., a CPU (Central Processing Unit) and a ROM (Read Only Memory) although not shown specifically. The ROM stores a program describing the operation procedure of the camera 10. The system controller 18 generates the control signals 18b in accordance with the above operation procedure and information fed from the operation panel 14 through a signal line 18a in response to operator's manipulation, i.e., an operation signal 14a. The control signals 18b are delivered not only to the lens system 12 but also to the timing signal generator 20 and driver 22 on the system bus 16 and signal line 18c. Further, the control signals 18b are fed to the preprocessor 28, signal processor 30, compander 32, storage 34 and monitor 36 although not shown specifically.

The timing signal generator 20 includes an oscillator, not shown, for generating a system clock on which the operation of the camera 10 is based. The oscillator may be implemented as a VCO (Voltage Controlled Oscillator) by way of example. The timing signal generator 20 feeds the system clock to the system controller 18 and other blocks of the camera 10 that need the system clock. At the same time, the timing signal generator 20 divides the frequency of the system clock to thereby generate various signals necessary for the camera 10.

More specifically, the timing signal generator 20 includes a circuit for generating timing signals 20a and 20b in accordance with the control signal 18b. The timing signal 20a is fed to the driver 22 while the timing signal 20b is fed to the preprocessor 28 and signal processor 30. The timing signal generator 20 additionally feeds various timing signals to the other blocks of the camera 10 as well, although not shown in FIG. 1.

The driver 22 generates drive signals 22a, 22b and 22c in accordance with the timing signal 20a. The drive signals 22a, 22b and 22c are fed to the lens system 12, mechanical shutter 24 and image pickup section 26, respectively. Particularly, the driver 22 generates the drive signal 22c in accordance with the camera mode or the movie mode selected by the operator.

The mechanical shutter 24 is operated by the operator via the shutter release button provided on the operation panel 14. More specifically, when the operator presses the shutter release button, the operation panel 14 feeds a control signal 14a to the system controller 18 through the system bus 16. In response, the system controller 18 delivers the control signal 18b to the driver 22 via the system bus 16 and signal line 18c. The control signal 18b causes the driver 22 to feed the drive signal 22b to the mechanical shutter 24.

The image pickup section 26 includes an optical low-pass filter 26a, a color filter 26b, and a solid-state image sensor 26c. The low-pass filter 26a and color filter 26b are affixed to one side of the image sensor 26c to which light representative of a scene is incident. The image sensor 26c is implemented as a single, color CCD (Charge Coupled Device) image sensor by way of example. When a light image is focused on the image sensor 26c by the lens system 12, the image sensor 26c outputs a signal 27 representative of the quantities of light incident to image sensing devices or photosensitive cells, which are arranged on the image sensor 26c.

Figure 2:
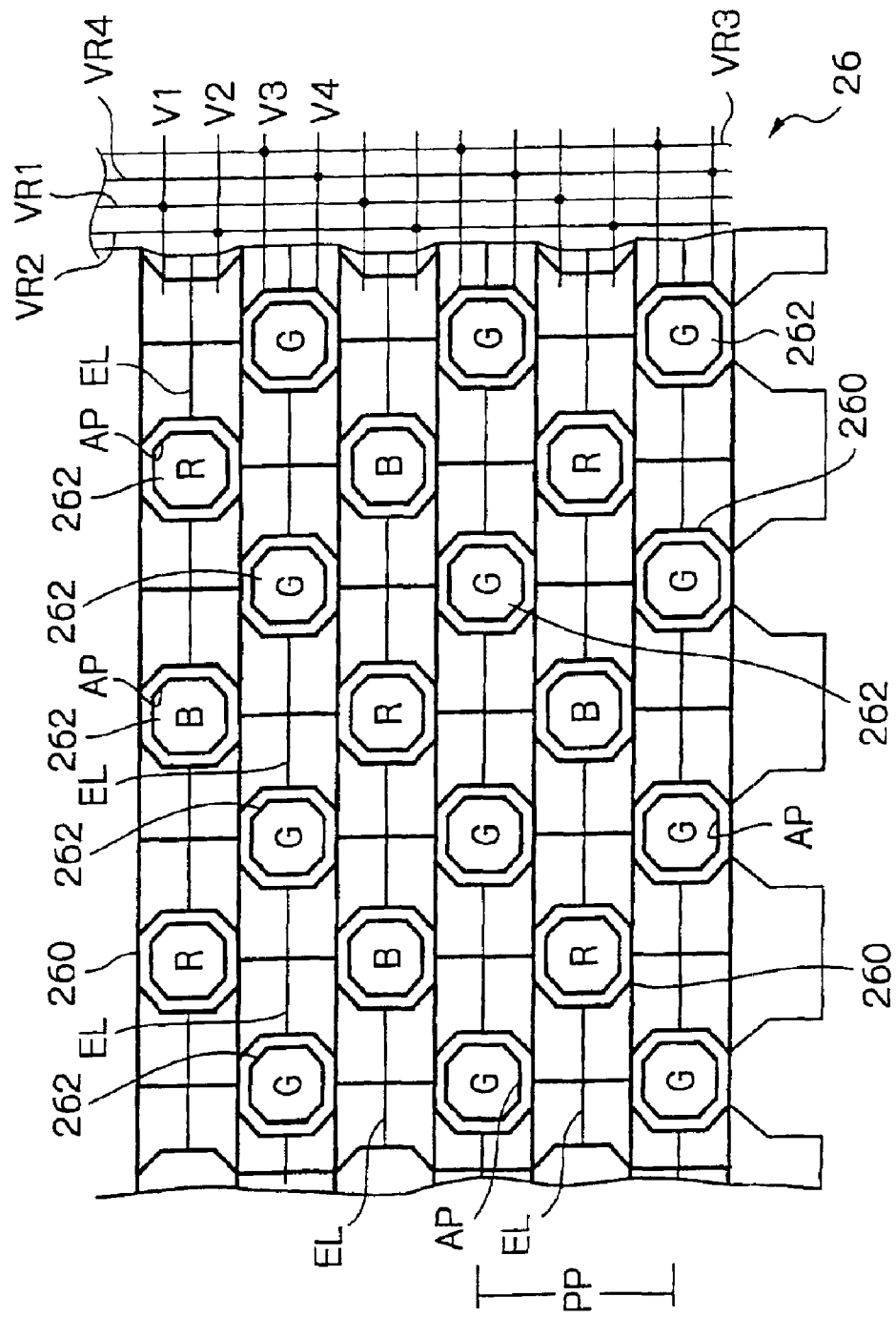
FIG. 2 is a view showing an image pickup section included in the illustrative embodiment, as seen from the light incidence side.

More specifically, the low-pass filter 26a, color filter 26b and image sensor 26c are sequentially arranged in this order, as named from the light incidence side, and constructed integrally with each other. As shown in FIG. 2, the color filter 26b, which is a single color filter, has color filter segments 260 corresponding one-to-one to image sensing devices or photosensitive cells 262 included in the image sensor 26c. The color filter segments 260 may be of three primary colors, i.e., red (R), green (G) and blue (B). FIG. 2 shows a specific arrangement in which the G filter segments 260 are arranged in a square lattice pattern while the filter segments 260 of the same color other than G diagonally face each other at opposite sides of each G filter segment 260. More specifically, the R filter segments 260 diagonally face each other at opposite sides of each G filter segment 260. This is also true with the B filter segments 260. The pattern shown in FIG. 2 will hereinafter be referred to as a honeycomb type G square lattice, RB full-checker pattern.

In FIG. 2, six of fourteen pixels are assigned to G while each four of the same is assigned to each of R and B. It is to be noted that the term "square lattice" mentioned in relation to G does not refer to the shape of the individual pixel, but refers to the pattern in which the G pixels are arranged. The individual pixel is polygonal, e.g., rectangular, hexagonal or octagonal.

The image sensing devices may be implemented as MOS (Metal Oxide Semiconductor) type, solid-state image sensing devices in place of CCDs, as will be described specifically later. Signal charges are generated in the image pickup section 26 by photoelectric transduction in accordance with the drive signal 22c and output at a preselected timing. For example, the signal charges are delivered to vertical transfer paths by field shift during vertical blanking period and then transferred to a horizontal transfer path by line shift. An output circuit, not shown, converts the signal charges output from the horizontal path to the signal 27, which is an analog voltage signal 27. The signal 27 is input to the preprocessor 28. When the image sensor 26c is implemented by CCDs, it selectively reads all pixels or part of them by reduction.

The preprocessor 28 includes a CDS (Correlated Double Sampling) circuit and an ADC (Analog-to-Digital Converter) although not shown specifically. The CDS circuit reduces noise, i.e., 1/f noise and reset noise contained in the analog voltage signal 27. The preprocessor 28 may additionally execute gamma correction with the analog signal. The resulting analog signal free from noise is input to the ADC. The ADC converts the analog signal to a digital signal 29 by quantization using a preselected quantization level in accordance with the timing signal 20b, which is fed from the timing signal generator 20. The timing signal 20b may include a conversion clock. The digital signal 29 is input to the signal processor 30.

The signal processor 30 includes a data corrector 30a with a frame memory function, an interpolator 30b, and a band-broadening processor 30c. The data corrector 30 includes a frame memory or buffer memory and a correcting circuit although not shown specifically. The interpolator 30b is constructed to execute gamma correction and white balance adjustment. Gamma correction allows power consumption and circuit scale to be reduced for thereby reducing the number of bits to be dealt with. This gamma correction will be omitted if it is assigned to the preprocessor 28.

The digital signal or image data 29 output from the preprocessor 28 are written to the frame memory of the data corrector 30a. The pixel data are repeatedly read out of the area of the frame memory that is sequentially shifted. In this respect, the frame memory should preferably be implemented as a nondestructive memory. The control signals 18b output from the system controller 18 include a control signal 18d input to the frame memory via the system bus 16. The control signal 18d includes some different signals for control, i.e., a write/read enable signal, a clock signal and so forth. The data corrector 30a adjusts, e.g., the gain of the individual filter segment in order to match the level of segment-by-segment image data to signal processing to follow. The image data stored in the frame memory are fed to the interpolator 30b in a preselected sequence as image data 38.

Figure 3:
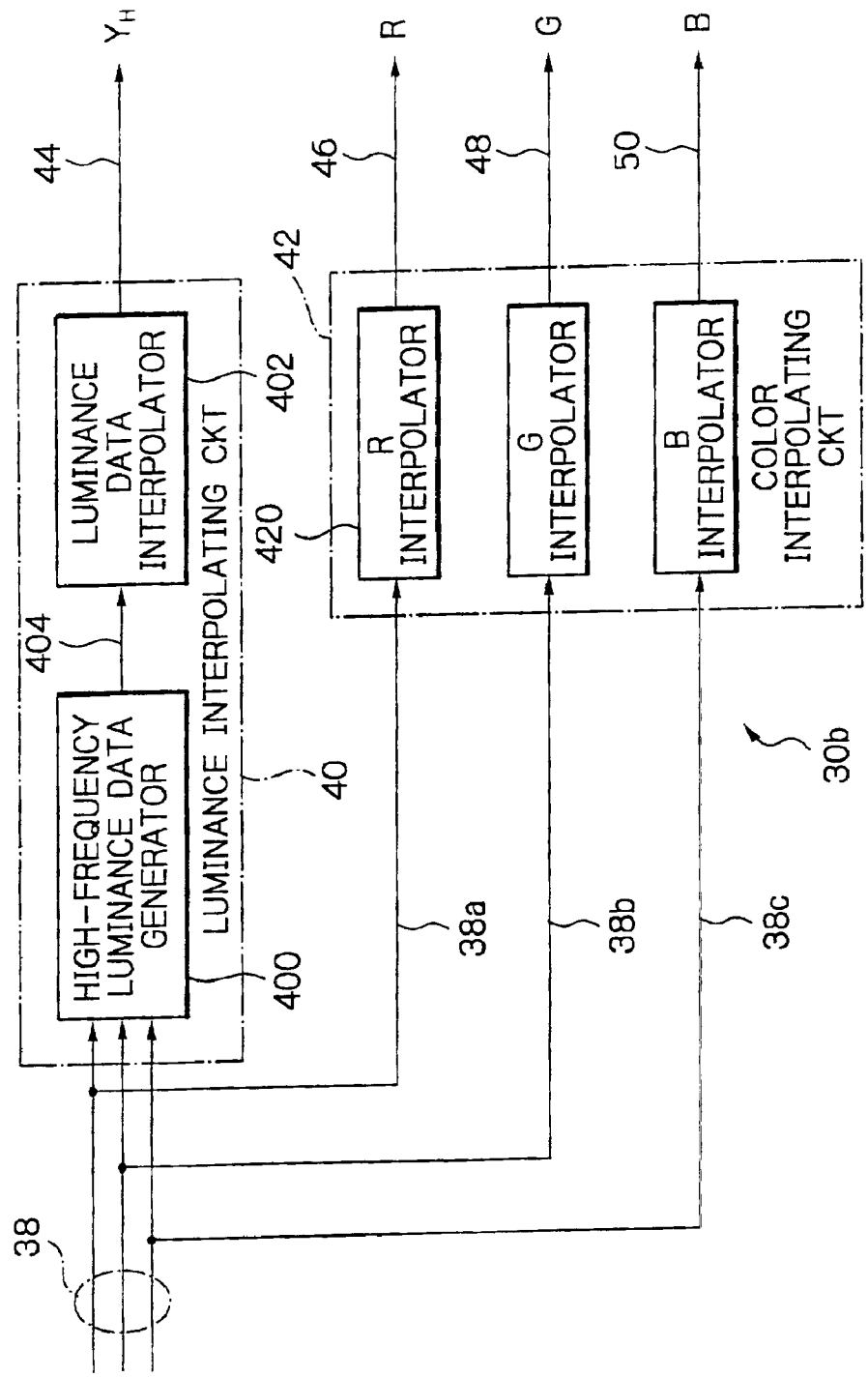
FIG. 3 is a schematic block diagram showing a specific configuration of an interpolator included in the illustrative embodiment.

In the illustrative embodiment, the interpolator 30b is capable of interpolating both of a still picture and a movie. The interpolator 30b switches the destination of the image data 38 in accordance with the operator's intention. Reference will be made to FIG. 3 for describing specific circuitry included in the interpolator 30b for interpolating a still picture.

As shown in FIG. 3, the circuitry is generally made up of a luminance interpolating circuit 40 and a color interpolating circuit 42. The interpolator 30b interpolates high-frequency luminance data $Y_H$ containing high frequency components and primary color data, i.e., R, G and B data in real pixels and virtual pixels intervening between the real pixels. The image data 38 output from the data corrector 30a are input to the luminance interpolating circuit 40 and color interpolating circuit 42. It is to be noted that the image data 38 are derived from the real pixels of the image sensor 26c where the photosensitive cells exist.

Specifically, the luminance interpolator 40 includes a high-frequency luminance data generator 400 and a luminance data interpolator 402. The high-frequency luminance data generator 400 produces high-frequency luminance data $Y_H$ (404), which contain high frequency components, from the image data 38 at the positions of the real pixels or those of the virtual pixels. In the illustrative embodiment, the generator 400 calculates high-frequency luminance data $Y_H$ at the positions of the real pixels. More specifically, the generator 400 determines a direction in which the pixel data 38 are correlated and then generates high-frequency luminance data $Y_H$ (404) in accordance with the direction of a correlation, as will be described in detail later. The luminance data interpolator 402 generates high-frequency luminance data $Y_H$ (44) at the positions of the virtual pixels by using the high-frequency luminance data $Y_H$ (404). In this manner, the luminance interpolating circuit 40 interpolates the high-frequency luminance data $Y_H$ in all of the real pixels and virtual pixels and delivers the interpolated high-frequency luminance data $Y_H$ (44) to the band-broadening processor 30c, FIG. 1.

If desired, the luminance interpolating circuit 40 may be constructed to generate high-frequency luminance data $Y_H$ for the virtual pixels and then generate high-frequency luminance data $Y_H$ for the real pixels by using them.

The color interpolating circuit 42 executes, by taking account of the color arrangement of the real pixels, interpolation for colors to which neither the virtual pixels nor the real pixels correspond, thereby generating R, G and B color data over the entire picture. For this purpose, the color interpolating circuit 42 includes an R interpolator 420, a G interpolator 422, and a B interpolator 424. R data 38a, G data 38b and B data 38c constituting the image data 38 are input to the R interpolator 420, G interpolator 422 and B interpolator 424, respectively. The R, G and B interpolators 420 through 424 execute interpolation by using the respective color data 38a through 38c to thereby generate R, G and B color data at the positions of all of the real and virtual pixels. Such interpolation will be described more specifically later. The R, G and B interpolators 420, 422 and 424 respectively feed the resulting R, G and B color data 46, 48 and 50 to the band-broadening processor 30c.

Figure 4:
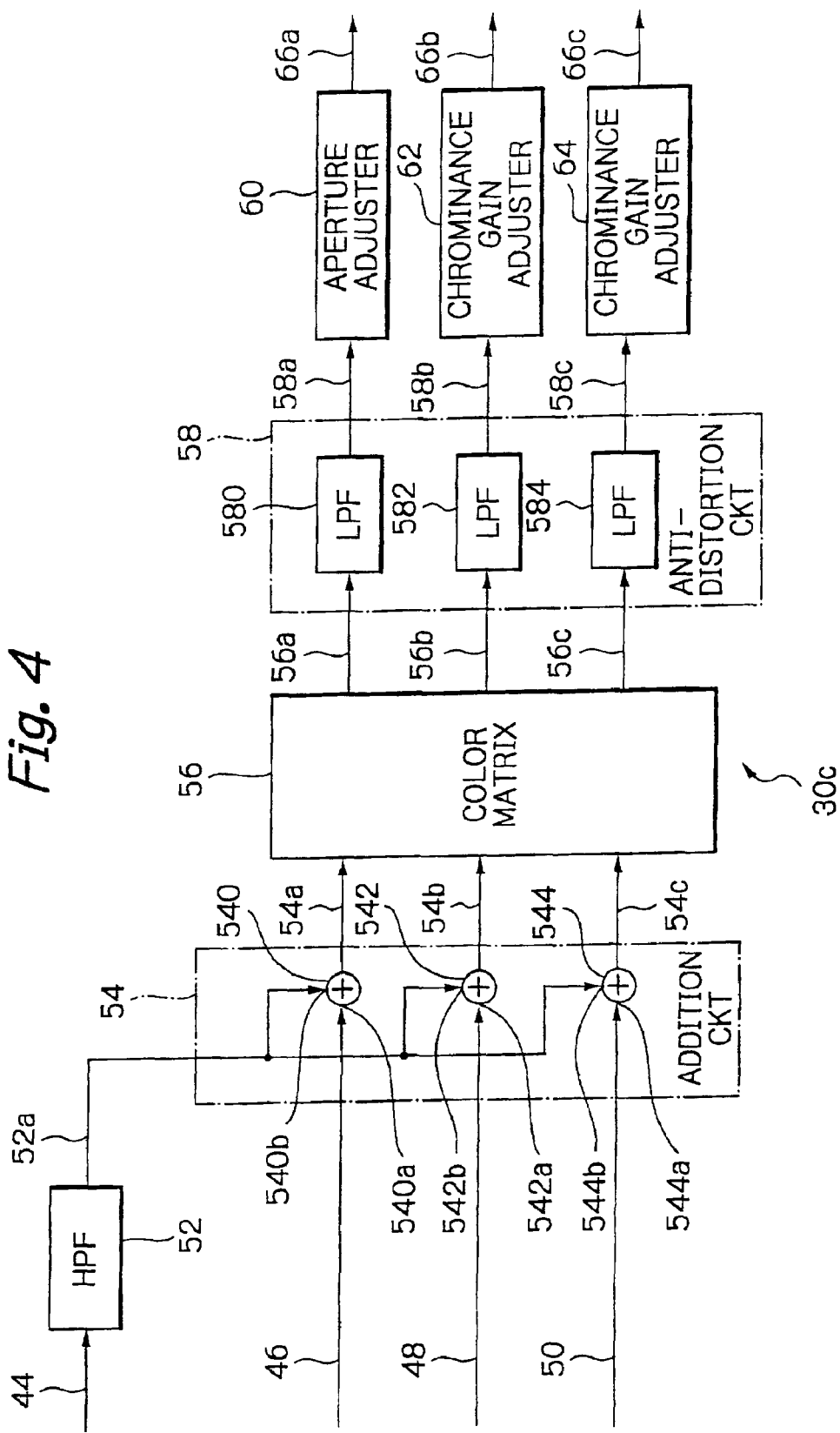
FIG. 4 is a schematic block diagram showing a specific configuration of a band-broadening processor included in the illustrative embodiment.

As shown in FIG. 4 specifically, the band-broadening processor 30c includes a high-pass filter (HPF) 52, an addition circuit 54, a color matrix 56, an anti-distortion circuit 58, an aperture adjuster 60, and chrominance gain adjusters 62 and 64. The HPF 52 separates high frequency components $Y_h$ from the high-frequency luminance data 44. The high frequency components $Y_h$ are input to the addition circuit 54 as a signal 52a. As for the color G, a switch, not shown, may be connected between the HPF 52 and the addition circuit 54 so as not to directly feed the high frequency components to the color G, in which case the system controller 18 will feed a switching signal to the switch.

The addition circuit 54 includes an R adder 540, a G adder 542 and a B adder 544. The R, G and B adders 540, 542 and 544 respectively receive the R, G and B color data 46, 48 and 50 via one end thereof 540a, 542a and 544a. Also, the R, G and B adders 540 through 544 receive the high frequency components $Y_h$ via the other ends thereof 540b, 542b and 544c, respectively. With this configuration, the addition circuit 54 adds the high frequency components to each of the R, G and B color data to thereby broaden the frequency bands of the color data. In this connection, the G pixel data themselves may be considered to have been broadened in frequency band because they contain high frequency components. The addition circuit 54 feeds R, G and B color data 54a, 54b and 54c with the broadened frequency bands to the color matrix 56.

The color matrix 56 produces luminance data Y and chrominance data or color data $C_r$ and $C_b$ from the R, G and B color data 54a, 54b and 54c by using conventional equations. The color matrix 56 feeds the luminance data Y (56a) and chrominance data $C_r$ (56b) and $C_b$ (56c) to the anti-distortion circuit 58.

The anti-distortion circuit 58 includes three LPFs (Low-Pass Filters) 580, 582 and 584 to which the luminance data Y (56a) and chrominance data $C_r$ (56b) and $C_b$ (56c), respectively, are input. The LPFs 580 through 584 are responsive even to high frequencies in order to obviate aliasing distortion without disturbing the frequency bands of the three input signals 56a through 56c. The LPF 580, among the others, passes up to the highest frequency in accordance with the luminance data Y. Further, the circuit 58 is configured to limit either one of a horizontal and a vertical frequency band overlapping each other, thereby protecting image quality from deterioration ascribable to overlapping frequencies. The circuit 58 feeds luminance data (58a) and chrominance data $C_r$ (58b) and $C_b$ (58c) subjected to the above processing to the aperture adjuster 60 and chrominance gain adjusters 62 and 64, respectively.

The aperture adjuster 60 adjusts an aperture by LPF processing in such a manner as to prevent the high frequency components from falling. This processing is equivalent in effect to edge enhancement. The chrominance gain adjusters 62 and 64 regulate the gains of the chrominance data $C_r$ (58b) and $C_b$ (58c) to a preselected level. The signal processor 30 feed luminance data Y (66a) and chrominance data $C_r$ (66b) and $C_b$ (66c) generated by the above processing to the compander 32.

Referring again to FIG. 1, the compander 32 includes a frame memory, a compression circuit and an expansion circuit although not shown specifically. The frame memory temporarily stores one frame of luminance data Y and chrominance data $C_r$ and $C_b$ input thereto. The compression circuit compresses the picture in accordance with, e.g., JPEG (Joint Photographic Experts Group) standards. The expansion circuit expands the compressed picture to thereby restore the original image data. The frame memory may be implemented by the frame memory of the signal processor 30, if desired. A plurality of frame memories may advantageously be used in order to deal with a movie, i.e., frames continuously picked up. The JPEG standards may be replaced with MPEG (Moving Picture Experts Group) standards or motion JPEG standards that apply the JPEG standards to the individual frame of a movie.

In a record mode, the compander 32 delivers the compressed data to the storage 34 over the system bus 16 under the control of the system controller 18. Also, the compander 32 is capable of simply passing the luminance data Y (66a) and chrominance data $C_r$ (66b) and $C_b$ (66c) therethrough to the system bus 16 under the control of the system controller 18. Further, the compander 32 is capable of transferring the signals output from the signal processor 30 to the monitor 36 over the system bus under the control of the system controller 18. In a play mode, the compander 32 reads the compressed data out of the storage 34 over the system bus 16 and expands them. The expanded data are written to the frame memory and then read out in a preselected sequence under the control of the system bus 18. The data read out of the frame memory are delivered to the monitor 36 and displayed thereby.

The storage 34 includes a recording section for recording the image data in a recording medium and a reproducing section for reading the image data out of the recording medium, although not shown specifically. The recording medium may be implemented by any one of Smart Media (trade name) or similar semiconductor memory, a magnetic disk, an optical disk and so forth. If use is made of a magnetic disk or an optical disk, then the storage 34 will additionally include a modulating section for modulating the image data and a head for writing the image data.

The monitor 36 displays the luminance data Y and chrominance data $C_r$ and $C_b$, or the R, G and B color data fed thereto over the system bus 16 under the control of the system controller 18. At this instant, the monitor 36 takes account of its screen size and adjusts the display timing.

As stated above, the camera 10 executes signal processing with a picture picked up and then records the processed picture. Also, the camera 10 reproduces recorded image data to thereby display them on the monitor 36 in the form of a picture, as desired.

Figure 5:
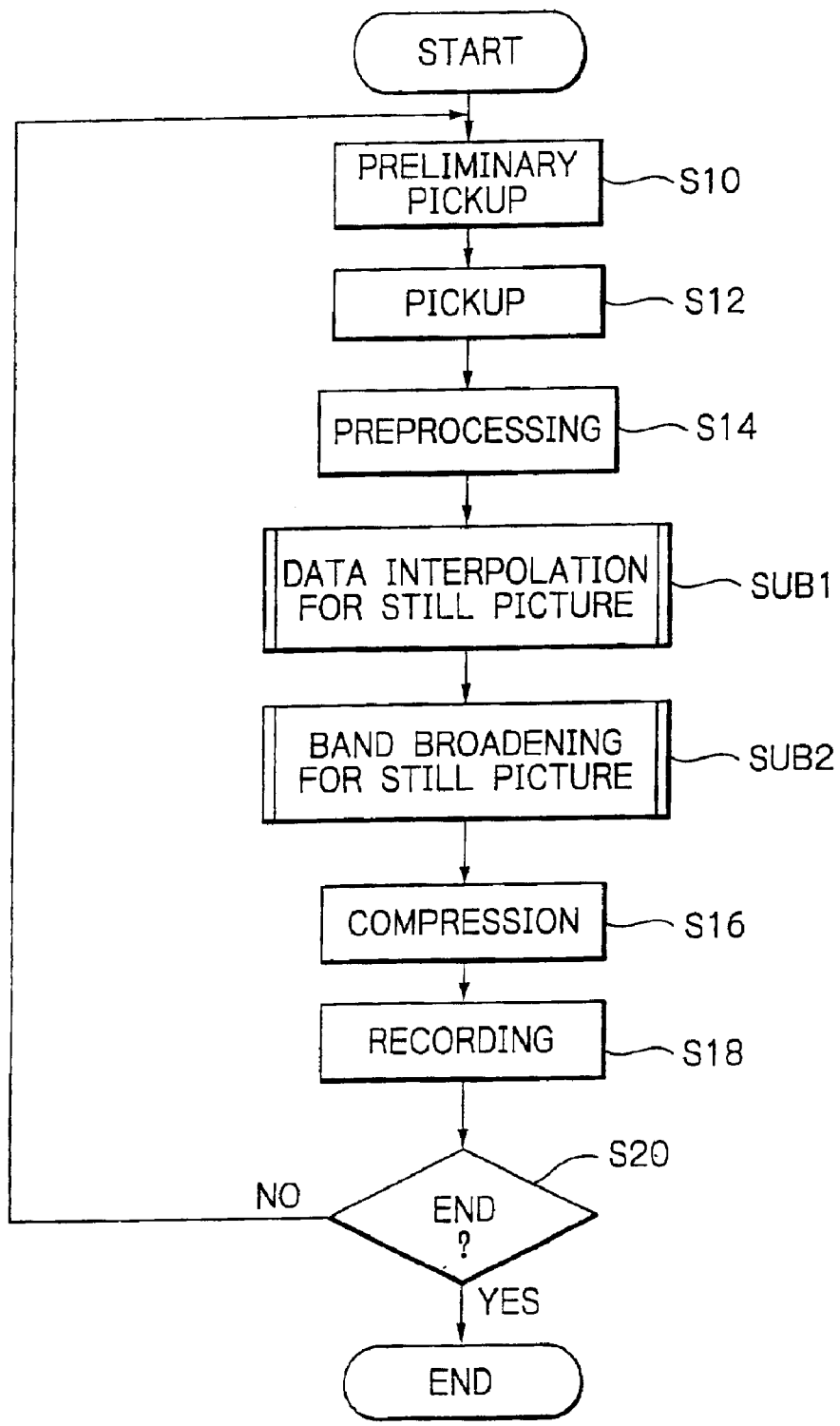
FIG. 5 is a flowchart useful for understanding a main routine unique to the illustrative embodiment.

The operation of the camera 10 will be described hereinafter. FIG. 5 shows a specific main routine to be executed by the camera 10 and also concentrating on a still picture. First, the user of the camera 10 switches on the camera 10 and then selects desired one of a plurality of modes available with the camera 10. When the operator selects the camera mode, the camera 10 continuously displays a scene being picked up through the lens system 12 on the monitor 36 while executing digital processing. This pickup will be referred to as preliminary pickup as distinguished from actual pickup to follow (step S10). Assume that the operator presses the shutter release button of the operation panel 14 to a half-stroke position during preliminary pickup. Then, the system controller 18 sets exposure conditions and adjusts the focal distance between the camera 10 and a subject to be picked up. The signal processor 30 may set parameters relating to the exposure conditions.

Subsequently, the operator presses the shutter release button to a full-stroke position at a desired timing so as to actually pick up the scene (step S12). In response, the operation panel 14 feeds an operation signal 14a to the system controller 18. On receiving the operation signal 14a, the system controller 18 delivers preselected control signals 18b to the timing signal generator 20 and driver 22 over the system bus 16 and signal line 18c. The camera 10 operates in accordance with timing signals and drive signals output from the timing signal generator 20 and driver 22, respectively. The image sensor 26c reads signal charges out of the pixels corresponding to the R, G and B color filter segments of the color filter 26b, which are arranged as described with reference to FIG. 2. The image sensor 26c then transforms the signal charges to analog R, G and B signals 27. The analog signals 27 are input to the preprocessor 28 in accordance with the timing signal 20b.

The preprocessor 28 cancels noise contained in the analog signals 27 and then converts analog signals 27 to digital signals or image data 29 (step S14). The image data 29 are input to the signal processor 30.

Figure 6:
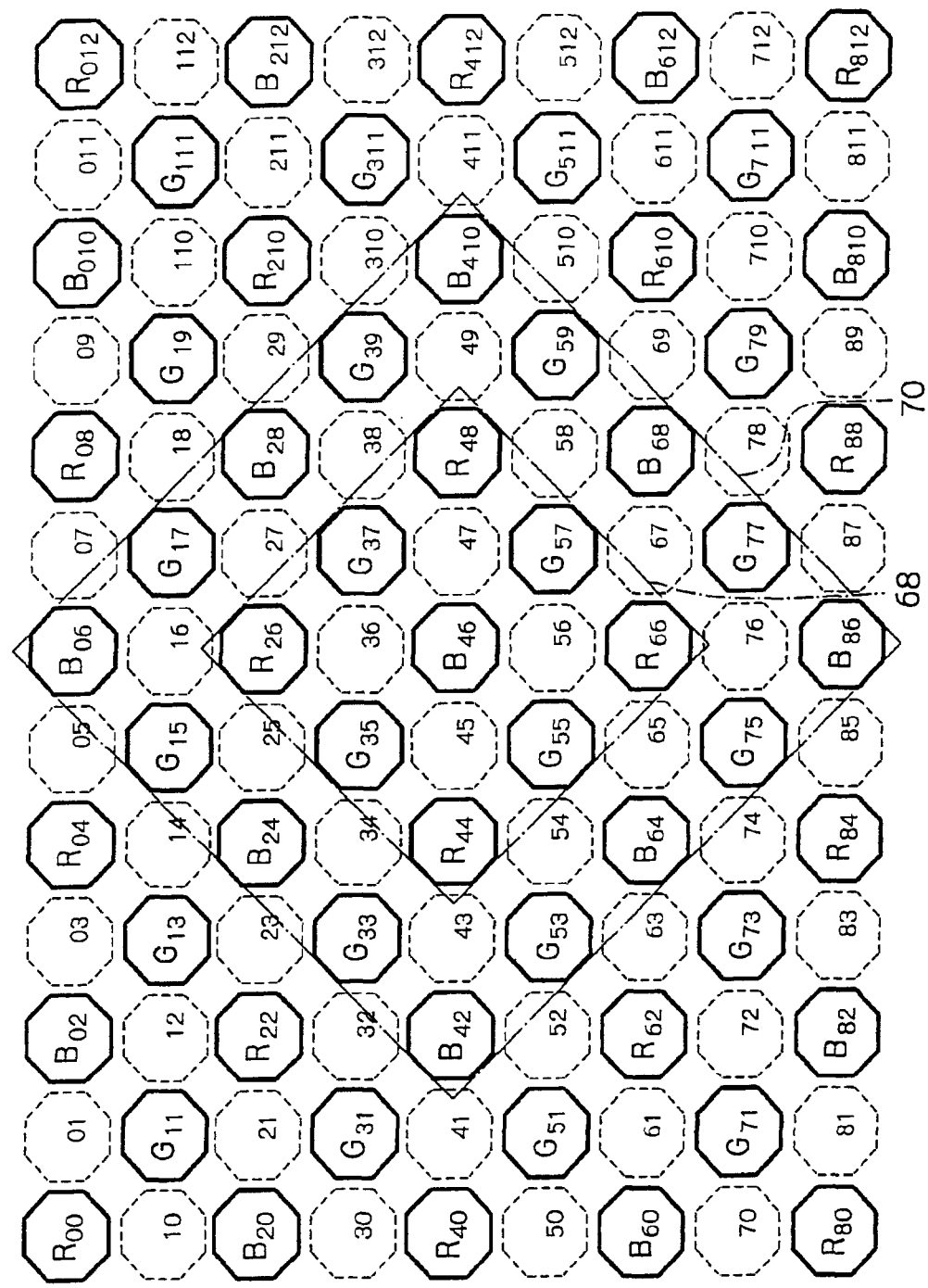
FIG. 6 shows a relation between the positions of real pixels and colors produced at the time of pickup included in the main routine.

The signal processor 30 sequentially executes data interpolation for a still picture (subroutine SUB1) and band broadening (subroutine SUB2) with the image data 29. FIG. 6 shows an exemplary relation between the image data 29 as to pixel positions. In FIG. 6, octagonal solid lines and octagonal phantom lines are representative of real pixels and virtual pixels, respectively. Letters R, G and B contained in the pixels indicate the colors of signals output from the pixels. Further, suffixes attached to R, G and B each indicate the position of the associated pixel in a matrix.

Before the data interpolation for a still picture, the data corrector 30a executes various kinds of correction including gamma correction and white balance correction with the pixel data each corresponding to a particular pixel. If desired, the data corrector 30a may include a frame memory in order to temporarily store the image data, in which case the pixels will be read out one by one and then subjected to the above correction. The corrected image data 38 may be again written to the frame memory or delivered to the interpolator 30b, as desired.

The interpolator 30b executes interpolation for a still picture on the basis of the image data 38 input thereto. This interpolation effectively increases resolution in relation to the honeycomb type, G square lattice, RB full-checker pattern, as will be described more specifically later. High-frequency luminance data $Y_H$ (44) and plain color data 46, 48 and 50 output from the interpolator 30b are fed to the band-broadening processor 30c.

The band-broadening processor 30c broadens the frequency band of each of the high-frequency luminance data $Y_H$ (44) and plain color data 46, 48 and 50. As a result, luminance data Y (66a) and chrominance data (B−Y) (66b) and (R−Y) (66c) broadened in frequency band are output from the band-broadening processor 30c.

Subsequently, the image data 66a, 66b and 66c are compressed (step S16). For compression, use may be made of the previously mention JPEG standards or MPEG standards in the movie mode or the JPEG standards in the camera mode, although not shown or described specifically. The compressed image data are written to the recording medium mounted to the storage 34 (step S18).

After the step S16, whether or not the camera 10 should end operating is determined (step S20). If the camera 10 should continue the operation (NO, step S20), then the procedure returns to the step S10. If the camera 10 should end the operation (YES, step S20), then the power supply to the camera 10 is shut off.

Figure 7:
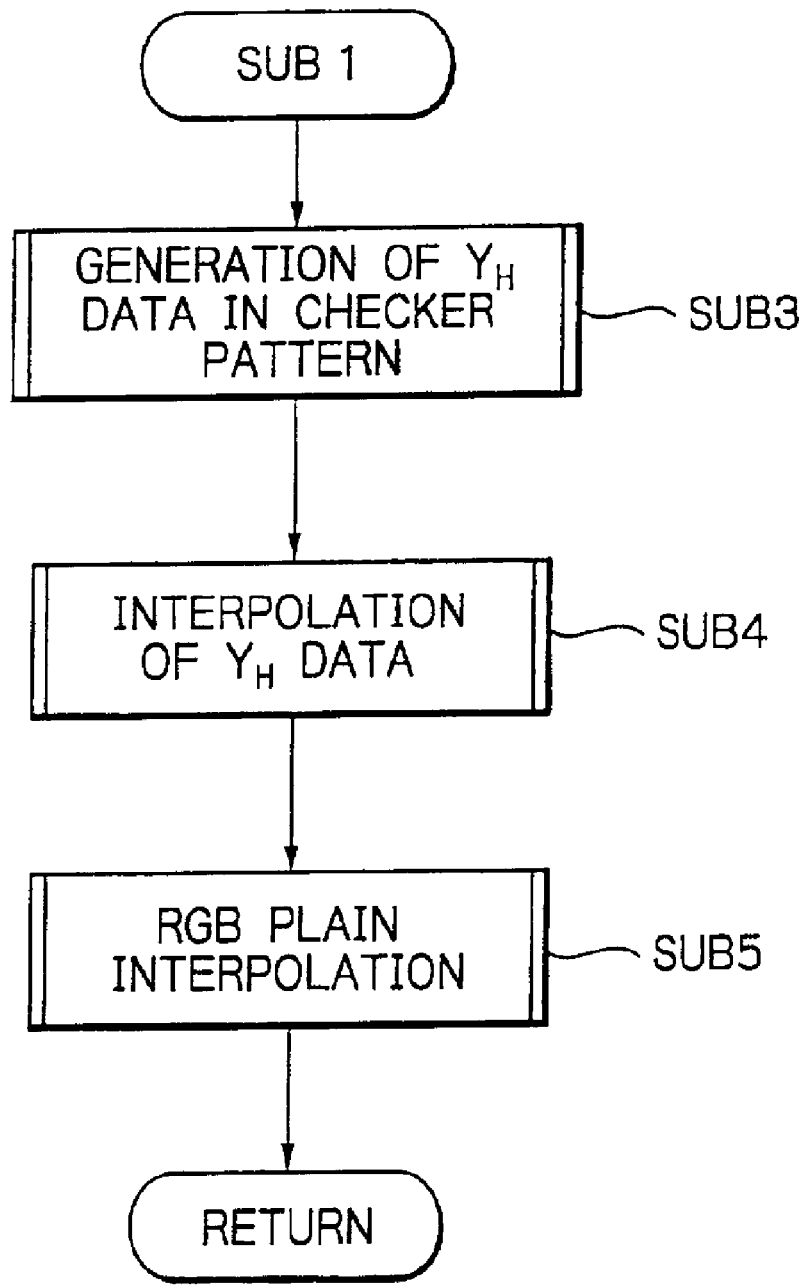
FIG. 7 is a flowchart showing a subroutine included in the main routine for executing interpolation signal processing for a still picture.

The interpolation subroutine SUB1 will be described in detail with reference to FIG. 7. As shown, the subroutine SUB1 includes subroutines SUB3, SUB4 and SUB5 assigned to the high-luminance data generator 400, luminance data interpolator 402 and color interpolating circuit 42, respectively. In the illustrative embodiment, the high-frequency luminance data generator 400 generates high-frequency luminance data $Y_H$ at the positions of the real pixels in a checker pattern (subroutine SUB3). Subsequently, the luminance data interpolator 402 interpolates luminance data in the virtual pixels by using the high-frequency luminance data $Y_H$ (subroutine SUB4). On the other hand, assume that the high-frequency luminance data generator 400 generates high-frequency luminance data $Y_H$ at the positions of the virtual pixels. Then, the luminance data interpolator 402 interpolates luminance data in the real pixels.

The color interpolating circuit 42 interpolates the colors (subroutine SUB5). As a result, R, G and B pixel data 46, 48 and 50 are generated over the entire picture including not only the real pixels but also the virtual pixels.

Figure 8:
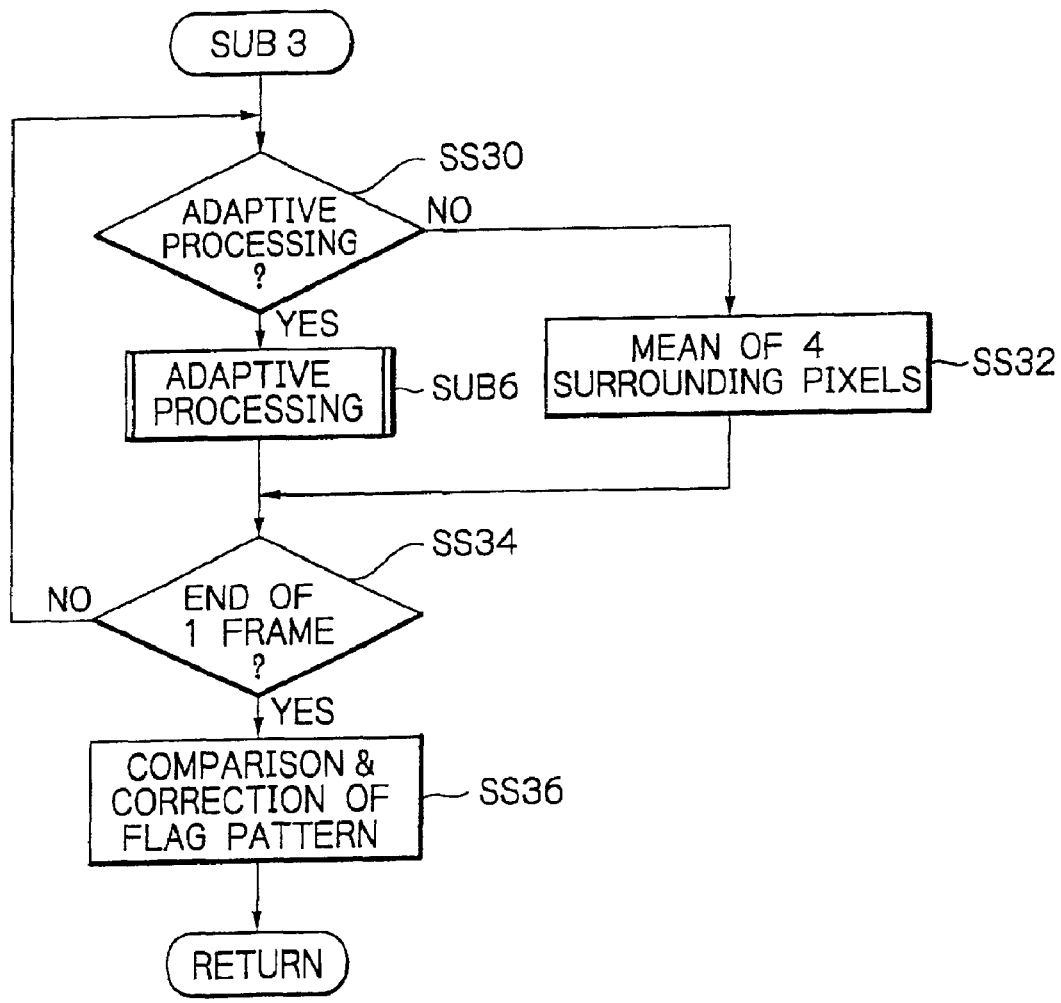
FIG. 8 shows a flowchart useful for understanding a subroutine included in the subroutine of FIG. 7 for generating high-frequency luminance data.

Reference will be made to FIGS. 8 through 11 for describing the subroutine SUB3 more specifically. First, as shown in FIG. 8, whether or not to execute adaptive processing is determined (substep SS30). The adaptive processing refers to producing high-frequency luminance data $Y_H$ from the pixel data by taking account of whether or not the pixel data are correlated. The camera 10 should preferably urge the operator to determine whether or not to execute the adaptive processing on the operation panel 14. For example, the camera 10 may automatically execute the adaptive processing when the operator does not make such a decision. The adaptive processing will be described in more detail later.

If the adaptive processing should be executed (YES, substep SS30), then a subroutine SUB6 is executed. If the adaptive processing should not be executed (NO, substep SS30), then the data of four surrounding pixels positioned in a square lattice pattern are averaged to generate high-frequency luminance data $Y_H$ (substep SS32).

After the subroutine SUB6 or the substep SS32, i.e., after high-frequency luminance data $Y_H$ has been generated for a certain pixel, whether or not interpolation has completed for one frame of real pixels is determined (substep SS34). If the answer of the substep SS34 is negative (NO), the procedure returns to the substep SS30. If the answer of the substep SS34 is positive (YES), comparison and correction are executed with the one frame of pixel data on a flag pattern basis (substep SS36), as will be described specifically later.

Figure 9:
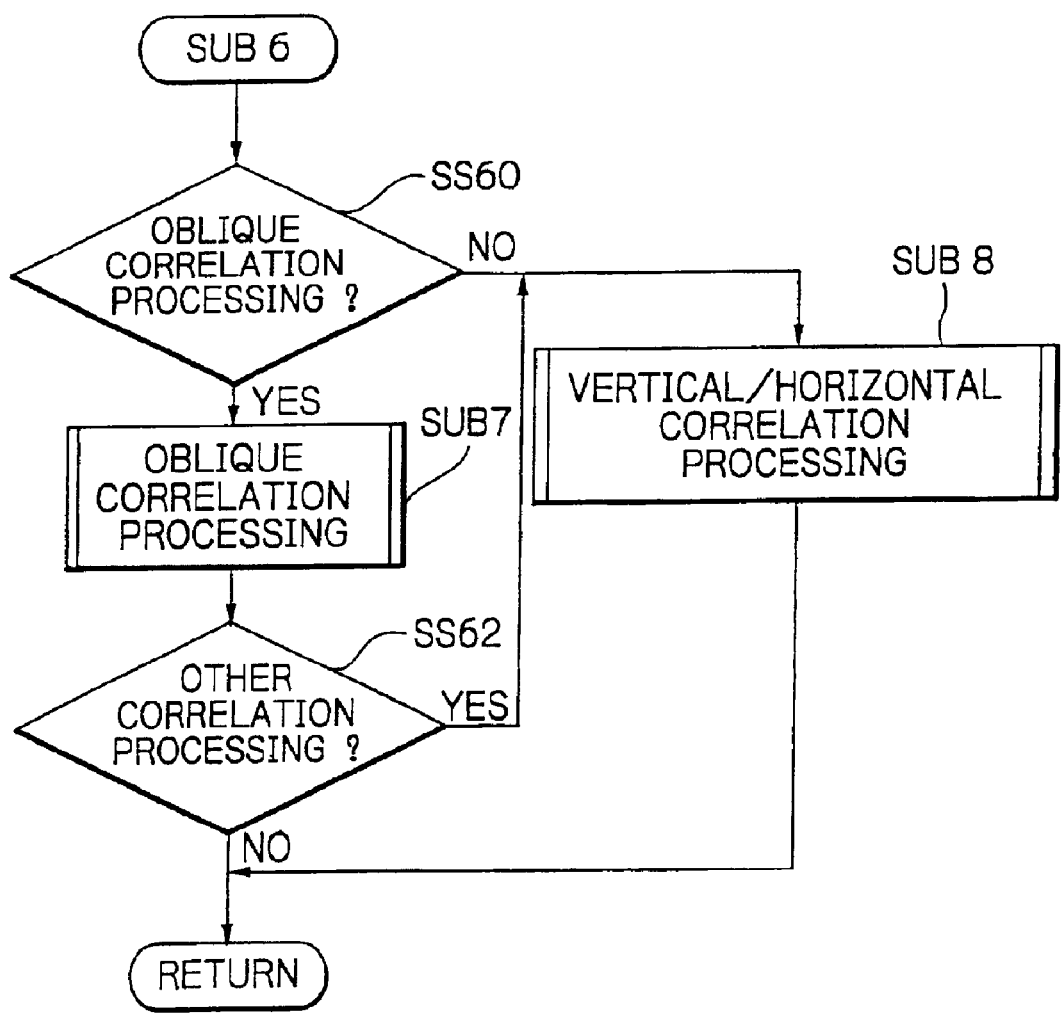
FIG. 9 shows a flowchart useful for understanding a subroutine included in the subroutine of FIG. 8 for executing adaptive processing.

Hereinafter will be described the adaptive processing that calculates high-frequency luminance data $Y_H$ on the basis of a correlation in the oblique direction, horizontal direction and/or vertical direction in accordance with the operator's setting. As shown in FIG. 9, whether or not a correlation should be detected in the oblique direction is determined (substep SS60). For this decision, use may be made of a flag set in the camera 10 beforehand. If the answer of the substep SS60 is YES, then high-frequency luminance data $Y_H$ is calculated by actual correlation decision processing (subroutine SUB7). If the answer of the substep SS60 is NO, then high-frequency luminance data $Y_H$ is calculated on the basis of a correlation in the vertical and/or the horizontal direction (subroutine SUB8).

After the subroutine SUB7, whether or not to execute correlation decision processing with pixel data derived from the subject pixel is determined (substep SS62) If the answer of the substep SS62 is YES, then the subroutine SUB8 is executed; if otherwise (NO, substep SS62), then the subroutine SUB6 ends.

Figure 10:
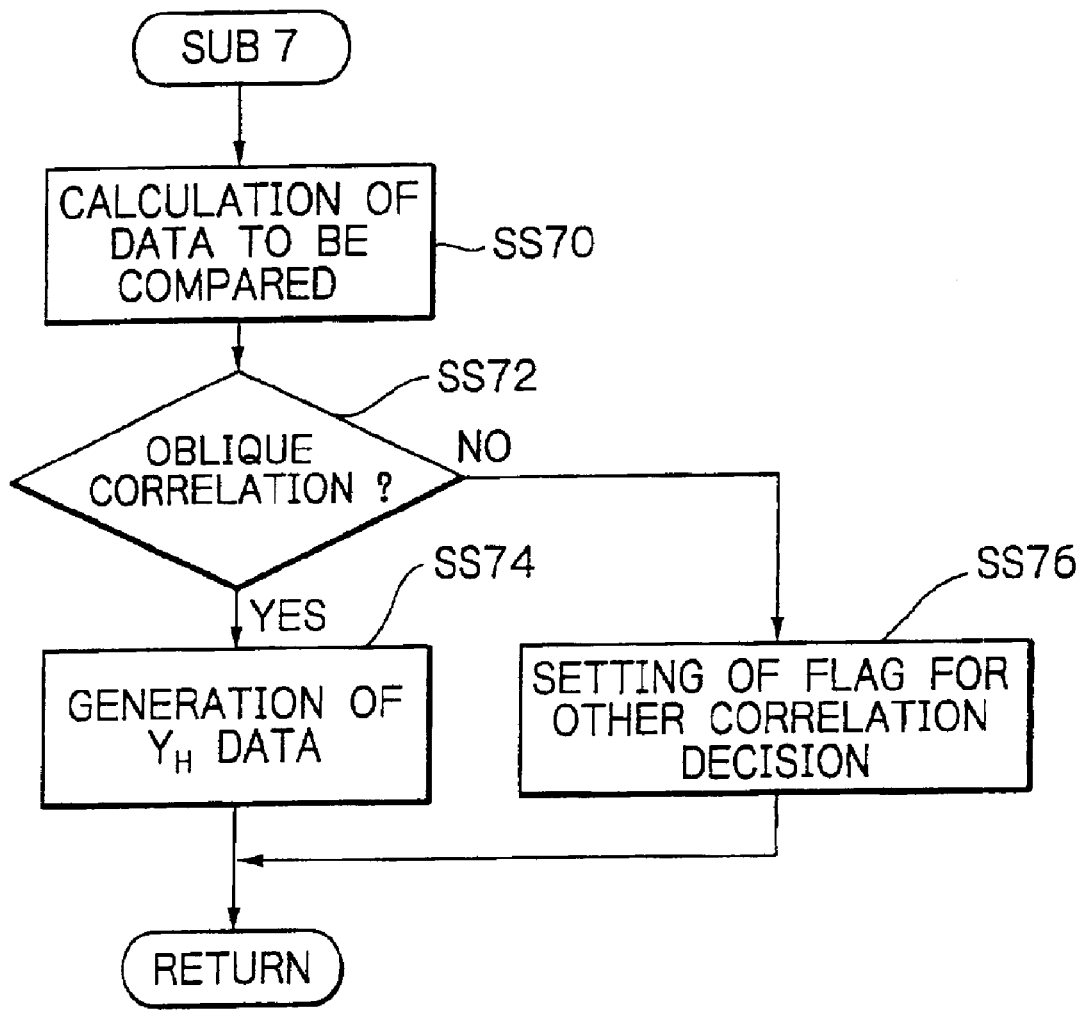
FIG. 10 is a flowchart showing a subroutine included in the subroutine of FIG. 9 for executing oblique correlation processing.

The correlation decision processing in the oblique direction will be described with reference to FIG. 10. As shown, data to be compared is calculated (substep SS70). The data to be compared is used to determine a direction in which pixel data surrounding subject pixel data to be subjected to adaptive processing are correlated. For example, assume that a color $B_{46}$ shown in FIG. 6 is the subject of adaptive processing. Then, data AG to be compared is produced from pixel data $G_{35}$, $G_{55}$, $G_{37}$ and $G_{57}$ surrounding the subject color $B_{46}$ by an equation:

$$AG=|G_{35}+G_{57}-(G_{37}+G_{55})| \qquad \text{Eq. (1)}$$

Even when the pixel data is the color R, the data AG is produced from surrounding G pixel data. The data AG produced by the Eq. (1) is greater one of two value shaving inclination in the right and left directions.

Subsequently, whether or not the pixel data obliquely facing each other at both sides of the subject pixel data are correlated, i.e., whether or not they have an oblique correlation is determined (substep SS70). For this decision, use is made of a reference value J1. If the data AG to be compared is greater than or equal to the reference value J1, then the above pixel data are determined to have an oblique correlation (YES, substep SS72). In this case, the four pixel data $G_{35}$, $G_{55}$, $G_{37}$ and $G_{57}$ surrounding the subject pixel $B_{46}$ are averaged to thereby generate high-frequency luminance data $Y_H$ for the subject pixel $B_{46}$ (substep SS74). If the data AG is smaller than the reference value J1 (NO, substep SS72), then a flag assigned to the other correlation decision processing is set (substep SS76).

Even the above procedure is likely to generate a spurious color. In the illustrative embodiment, as for pixel data R positioned near the boundary of a pixel where a spurious color is likely to appear, high-frequency luminance data $Y_H$ is produced by the above-described calculation in order to desirably reduce spurious colors at the boundary in the whole picture. Adaptive high-frequency luminance data can also be generated for pixel data $B_{24}$ by calculating data to be compared and then determining a correlation, although not described specifically. Thereafter, the subroutine SUB7 ends.

Figure 11A:
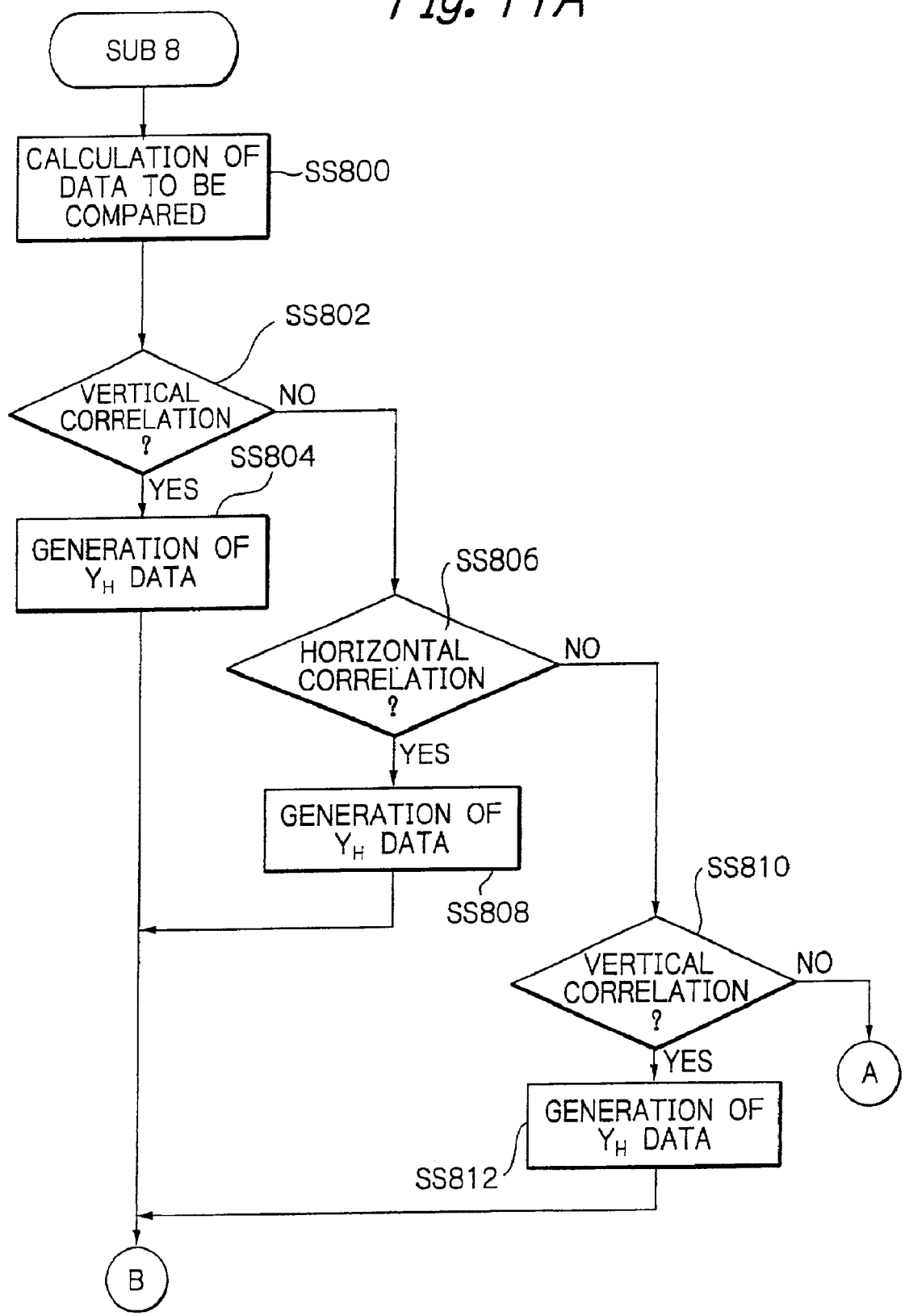
FIG. 11A is a flowchart showing part of a vertical/horizontal correlation subroutine included in the subroutine of FIG. 9.
Figure 11B:
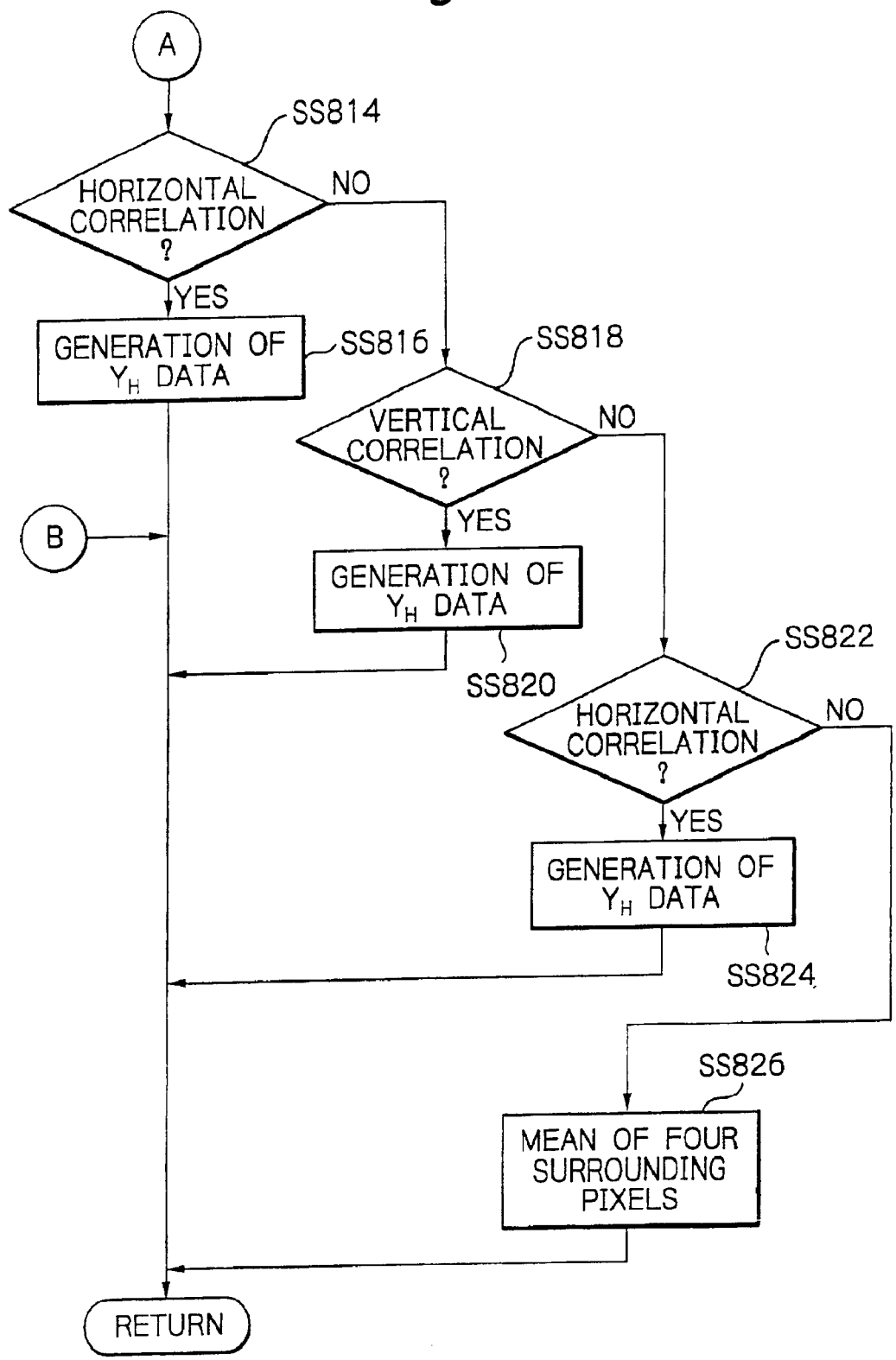
FIG. 11B is a flowchart showing the other part of the vertical/horizontal correlation subroutine.

The decision on a vertical/horizontal correlation will be described hereinafter with reference to FIGS. 11A and 11B. Again, assume that the vertical/horizontal correlation processing is applied to the pixel or color $B_{46}$ shown in FIG. 6. The processing is executed over an area 68 containing eight real pixels $R_{26}$, $G_{35}$, $G_{37}$, $R_{44}$, $R_{48}$, $G_{55}$, $G_{57}$ and $R_{66}$ surrounding the subject pixel $B_{46}$. The illustrative embodiment additionally takes account of an area 70, which surrounds the area 68, for the purpose of further enhancing accurate decision. More specifically, among the pixels lying in the area 70, only four real pixels $B_{06}$, $B_{42}$, $B_{410}$ and $B_{86}$ of the same color as the subject pixel $B_{46}$ and positioned at the four corners of the area 70 are used for the decision. The real pixels $B_{06}$ and $B_{86}$ face each other in the vertical direction while the real pixels $B_{42}$ and $B_{410}$ face each other in the horizontal direction.

Particular data to be compared is calculated for each of the areas 68 and 70 (substep SS800). Data $ARB_H$, $ARB_V$, $ACB_H$, $ACB_V$, $AGB_H$ and/or $AGB_V$ is the data to be compared relating to the area 68. Data $ACBB_H$ and $ACBB_V$ are the data to be compared for the area 70. In each data, the first letter A indicates arithmetic operation. The second letters R and G indicate the color to be used for arithmetic operation each. The second letter C indicates comparison with the subject pixel. The third letter B indicates the color to be used for the arithmetic operation or the color of the subject pixel. The fourth letter indicates the color of the subject pixel. Further, the suffixes H and V attached to the third letter or the fourth letter indicate the horizontal direction and vertical direction, respectively.

For example, the data to be compared for the subject pixel $B_{46}$ are produced by:

$$ARB_H=|R_{44}-R_{48}| \qquad \text{Eq. (2a)}$$

$$ARB_V=|R_{26}-R_{66}| \qquad \text{Eq. (2b)}$$

$$ACB_H=|R_{44}-B_{46}|+|R_{48}-B_{46}| \qquad \text{Eq. (2c)}$$

$$ACB_V=|R_{26}-B_{46}|+|R_{66}-B_{46}| \qquad \text{Eq. (2d)}$$

$$AGB_H=|G_{35}-G_{37}|+|G_{55}-G_{57}| \qquad \text{Eq. (2e)}$$

$$AGB_V=|G_{35}-G_{55}|+|G_{37}-G_{57}| \qquad \text{Eq. (2f)}$$

$$ACBB_H=|B_{42}-B_{46}|+|B_{410}-B_{46}| \qquad \text{Eq. (2g)}$$

$$ACBB_V=|B_{06}-B_{46}|+|B_{86}-B_{46}| \qquad \text{Eq. (2h)}$$

The data to be compared may alternatively be produced before the decision on a vertical/horizontal correlation. As for the decision on a vertical/horizontal correlation, reference values J2, J3 and J4 are set beforehand for each of the vertical and horizontal sets. The reference values J2 through J4 are selected by experience.

Subsequently, whether or not the pixel data facing each other in the vertical direction with the intermediary of the subject data $B_{46}$ are correlated is determined (substep SS802). Specifically, a correlation value ($ARB_H$–$ARB_V$) is produced from the data $ARB_V$ in the vertical direction and the data $ARB_H$ in the horizontal direction. If the correlation value ($ARB_H$–$ARB_V$) is smaller than the new reference value J2 (NO, step SS802), then it is determined that the above pixel data are not correlated in the vertical direction. This is followed by a decision on a horizontal correlation (substep SS806). If the correlation value ($ARB_H$–$ARB_V$) is greater than or equal to the reference value J2 (YES, substep SS802), then it is determined that the data are correlated in the vertical direction, i.e., close to each other. This is followed by the generation of high-frequency luminance data $Y_H$ (substep SS804).

In the substep SS804, high-frequency luminance data $Y_H$ is calculated by using the subject pixel $B_{46}$ and pixels $R_{26}$ and $R_{66}$. Basically, high-frequency luminance data $Y_H$ can be represented by either one of pixel data G and a color complementary thereto, e.g., magenta (Mg). Magenta Mg can be calculated as a mean value of (0.5*R+0.5*B) of the pixel data R and B, as well known in the art. In this case, high-frequency luminance data $Y_{H46}$ is produced by:

$$Y_{H46}=B_{46}/2+(R_{26}+R_{66})/4 \quad \text{Eq. (3)}$$

A flag "v" indicative of a vertical correlation is attached to the high-frequency luminance data $Y_H$. After the substep SS804, the procedure determines that high-frequency luminance data $Y_H$ has been calculated for the pixel $B_{46}$, and then returns.

In the substep SS806, whether or not pixel data facing each other in the horizontal direction with the intermediary of the subject pixel data $B_{46}$ are correlated, i.e., whether or not they have a horizontal correlation is determined. More specifically, whether or not a correlation value ($ARB_V$–$ARB_H$) is smaller than the reference value J2 is determined. If the correlation value ($ARB_V$–$ARB_H$) is smaller than the reference value J2, then it is determined that the above pixel data are not correlated in the horizontal direction (NO, substep SS806). This is followed by a decision on a vertical direction (substep SS810). If the correlation value ($ARB_V$–$ARB_H$) is greater than or equal to the reference value J2, then it is determined that the data are correlated in the horizontal direction (YES, substep SS806). This is followed by the generation of high-frequency luminance data $Y_H$ (substep SS808).

In the substep SS808, high-frequency luminance data $Y_H$ is calculated by using the subject pixel $B_{46}$ and pixels $R_{44}$ and $R_{48}$. The high-frequency luminance data is produced by:

$$Y_{H46}=B_{46}/2+(R_{44}+R_{48})/4 \quad \text{Eq. (4)}$$

The flag "h" indicative of a horizontal correlation is attached to the high-frequency luminance data $Y_H$. After the step SS808, the procedure returns by determining that high-frequency luminance data $Y_H$ has been calculated for the pixel $B_{46}$.

In the substep SS810, a decision on a vertical correlation is made by using the real pixels around the subject pixel $B_{46}$ whose high-frequency luminance data $Y_H$ should be calculated. When the decision is to be made by reducing the distance between the subject pixel $B_{46}$ and the surrounding pixels, use is made of the data $ACB_H$ and $ACB_V$ and reference value J3. If a correlation value ($ACB_H$–$ACB_V$) is smaller than the reference value J3, then it is determined that the surrounding pixels are not correlated in the vertical direction (NO, substep 810). This is followed by a decision on a horizontal correlation (substep SS814, FIG. 11B) via a connector A. If the correlation value ($ACB_H$–$ACB_V$) is greater than or equal to the reference value J3, then it is determined that the above data are correlated in the vertical direction (YES, substep SS810). This is followed by the calculation of high-frequency luminance data (step SS812).

As for the area 68, the decision on a vertical correlation may be made by using the pixels nearest to the subject pixel $B_{46}$, i.e., the G pixels, in which case the data $AGB_H$ and $AGB_V$ to be compared are used. Specifically, a correlation value ($AGB_H$–$AGB_V$) is compared with the reference value J3 in the same manner as described above.

In the substep SS812, high-frequency luminance data $Y_H$ is calculated by using the subject pixel $B_{46}$, pixels $R_{26}$ and $R_{66}$ and Eq. (3). The flag "v" indicative of a vertical correlation is attached to the high-frequency luminance data $Y_H$. After the substep SS812, the procedure returns via a connector B by determining that high-frequency luminance data $Y_H$ for the pixel $B_{46}$ has been calculated.

In the substep SS814, a decision on a horizontal correlation is made by using the real pixels around the subject pixel $B_{46}$. Again, when the decision is to be made by reducing the distance between the subject pixel $B_{46}$ and the surrounding pixels, the data $ACB_H$ and $ACB_V$ and reference value J3 are used. A correlation value is ($ACB_V$–$ACB_H$) If the correlation value ($ACB_V$–$ACB_H$) is smaller than the reference value J3, then it is determined that the surrounding pixels are not correlated in the horizontal direction (NO, substep SS814). This is followed by a decision on a vertical correlation (substep SS818). If the correlation value ($ACB_V$–$ACB_H$) is greater than or equal to the reference value J3, then it is determined that the pixels are correlated in the horizontal direction (YES, substep SS814). This is followed by the calculation of high-frequency luminance data $Y_H$ (substep SS816).

The decision on a horizontal correlation may also be made with respect to a narrower area by using pixels nearest to the subject pixel $B_{46}$ within the area 68, i.e., G pixels, in which case the data $AGB_H$ and $AGB_V$ will be used for comparison. More specifically, a correlation value ($AGB_V$–$AGB_H$) will be compared with the reference value J3 in the same manner as described earlier.

In the substep SS816, high-frequency luminance data $Y_H$ for the subject pixel $B_{46}$ is calculated by using the subject pixel $B_{46}$, pixels $R_{44}$ and $R_{48}$ and Eq. (4). The flag "h" indicative of a horizontal correlation is attached to the luminance data $Y_H$. Thereafter, the procedure returns by determining that high-frequency luminance data $Y_H$ for the pixel $B_{46}$ has been calculated.

As stated above, a decision on a vertical correlation and a decision on a horizontal correlation each are effected in two steps for the accuracy purpose. Also, the two-step decision is effected in a direction in which the area to be dealt with is narrowed toward the subject pixel. However, when an elongate subject with a particular width is picked up, adequate high-frequency luminance data $Y_H$ cannot sometimes be obtained, resulting in low image quality. In light of this, the illustrative embodiment makes a further decision on a correlation with respect to the area 70 broader than the area 68.

Specifically, in the substep SS818, a decision on a vertical correlation is made by using real pixels around the subject pixel $B_{46}$ and lying in the broader area 70. Specifically, the subject pixel $B_{46}$ and four pixels $B_{06}$, $B_{42}$, $B_{410}$ and $B_{86}$ surrounding it are used for the decision. The four pixels around the subject pixel $B_{46}$ are of the same color as the subject pixel $B_{46}$. A correlation value ($ACBB_H$–$ACBB_V$) calculated by using the data $ACBB_H$ and $ACBB_V$ is compared with the reference value J4. If the correlation value ($ACBB_H$–$ACBB_V$) is smaller than the reference value J4, it is determined that a correlation does not exist in the vertical direction (NO, substep SS818). This is followed by a decision on a horizontal correlation (substep SS822). If the correlation value ($ACBB_H$–$ACBB_V$) is greater than or equal to the reference value J4 (YES), then it is determined that a correlation exists in the vertical direction (YES, substep SS818). This is followed by the calculation of high-frequency luminance data $Y_H$ (substep SS820).

In the substep SS820, high-frequency luminance data $Y_H$ for the subject pixel $B_{46}$ is calculated by using pixels $R_{26}$ and $R_{66}$ and Eq. (3). The flag "v" indicative of a vertical correlation is attached to the luminance data $Y_H$. Thereafter, the procedure returns by determining that high-frequency luminance data $Y_H$ for the subject pixel $B_{46}$ has been calculated.

Subsequently, in the substep SS822, a decision on a horizontal correlation is made by again using real pixels around the subject pixel $B_{46}$ and lying in the broader area 70. Specifically, the subject pixel $B_{46}$ and four pixels $B_{06}$, $B_{42}$, $B_{410}$ and $B_{86}$ surrounding it are used for the decision. A correlation value ($ACBB_V$–$ACBB_H$) calculated by using the data $ACBB_V$ and $ACBB_H$ is compared with the reference value J4. If the correlation value ($ACBB_V$–$ACBB_H$) is smaller than the reference value J4, then it is determined that a correlation does not exist in the horizontal direction (NO, substep SS822). This is followed by the calculation of a mean value of four surrounding pixels (substep SS826). If the correlation value ($ACBB_V$–$ACBB_H$) is greater than or equal to the reference value J4 (YES), then it is determined that a correlation exists in the horizontal direction (YES, substep SS822). This is followed by the calculation of high-frequency luminance data $Y_H$ (substep SS824).

In the substep 824, high-frequency luminance data $Y_H$ is calculated by using the subject pixel $B_{46}$, pixels $R_{26}$ and $R_{66}$ and Eq. (4). The flag "h" indicative of a horizontal correlation is attached to the luminance data $Y_H$. Thereafter, the procedure returns by determining that high-frequency luminance data $Y_H$ for the subject pixel $B_{46}$ has been calculated.

In the substep SS826, a mean value of four pixels around the subject pixel $B_{46}$ is produced. Specifically, high-frequency luminance data $Y_{H46}$ for the subject pixel $B_{46}$ is calculated by using pixel data derived from all real pixels except color G pixels that lie in the area 68:

$$Y_{H46}=B_{46}/2+(R_{26}+R_{44}+R_{410}+R_{66}) \qquad \text{Eq. (5)}$$

Figure 12:
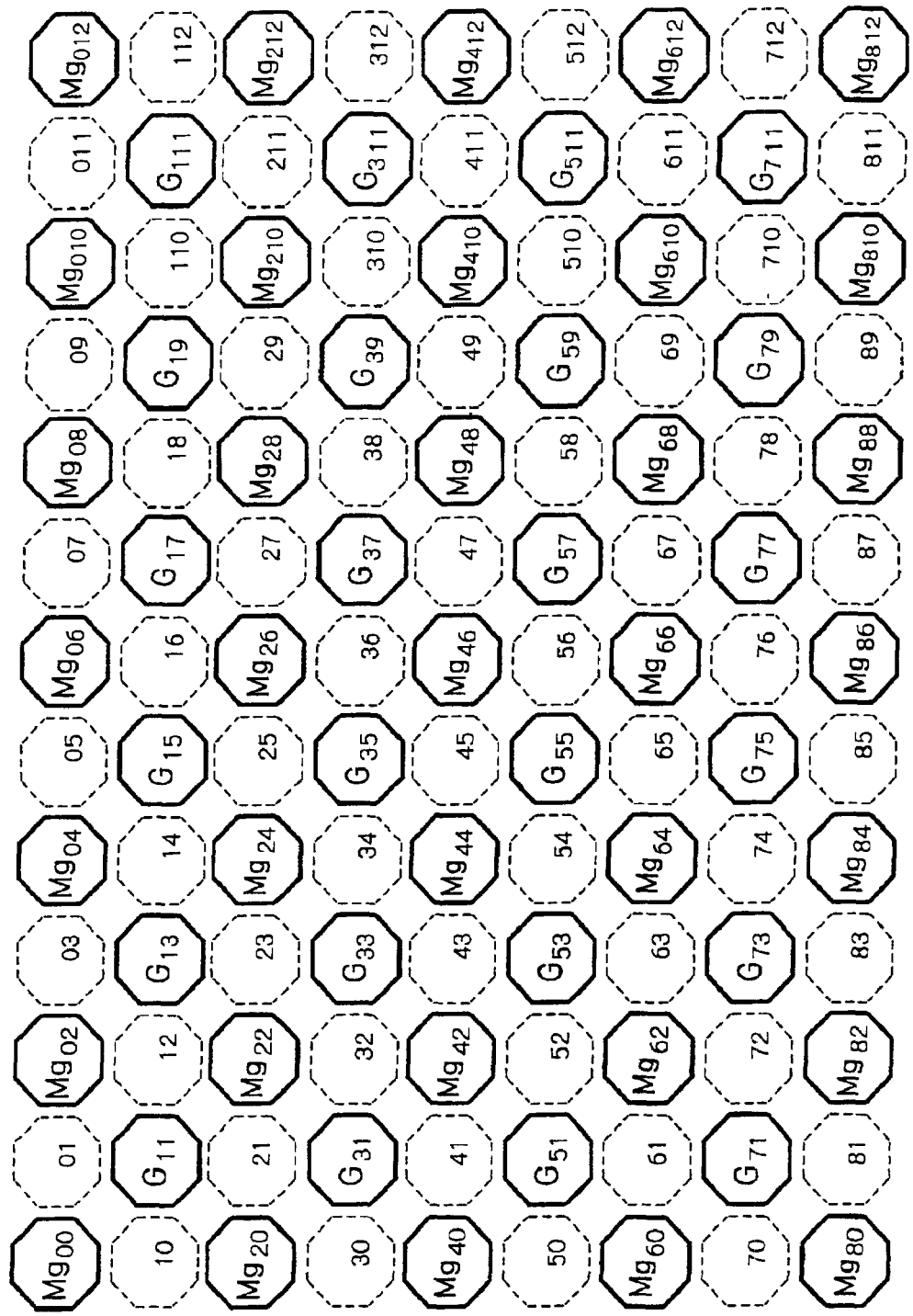
FIG. 12 shows a positional relation between magenta pixel data generated by the procedure of FIG. 8 and green pixel data G output at the time of a shot.
Figure 13:
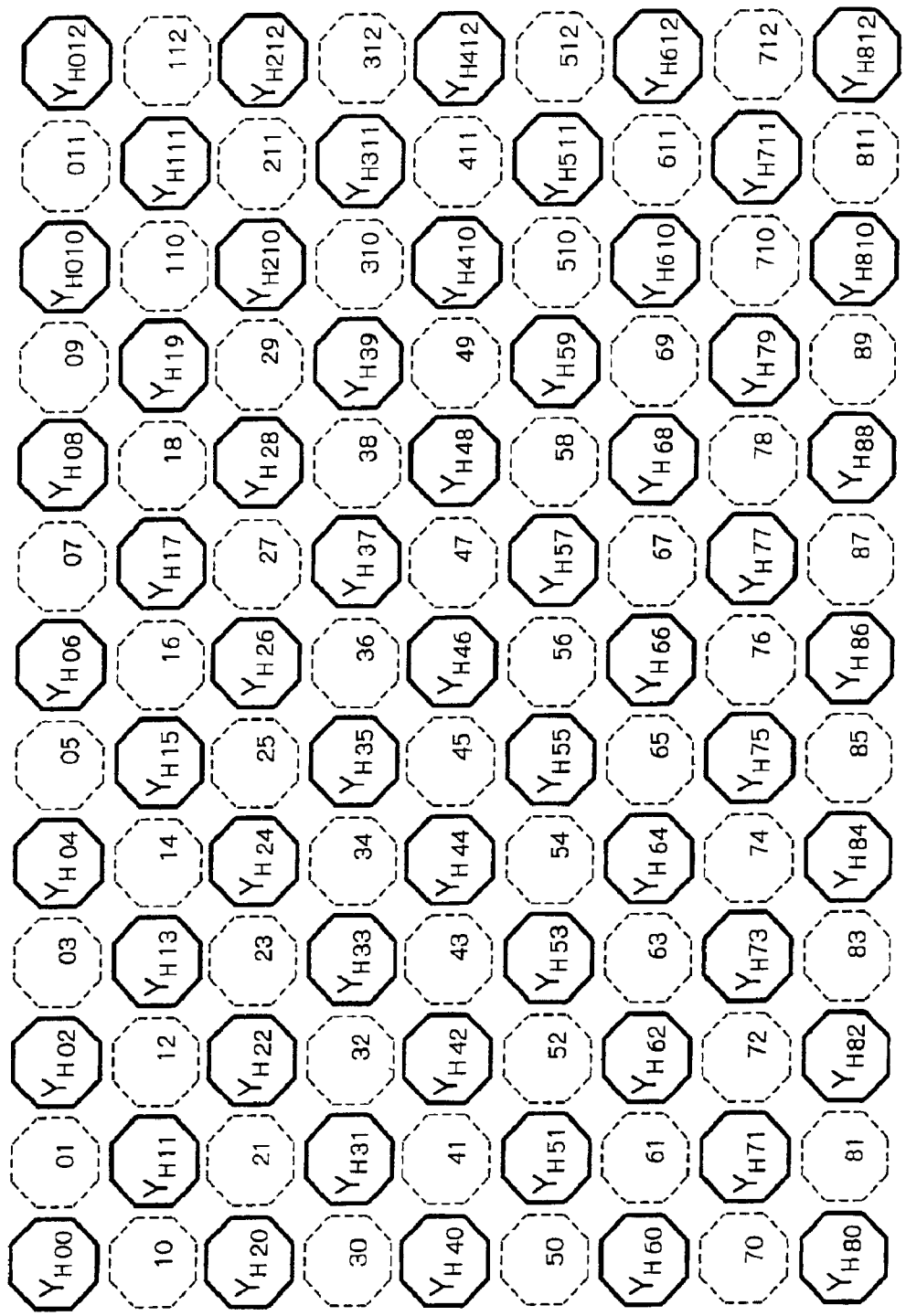
FIG. 13 shows a pattern to occur when the green pixel data and magenta pixel data are dealt with as high-frequency luminance data.

A flag "+" indicative of calculation performed without any correlation is attached to the high-frequency luminance data $Y_H$. The flag "+" means that the color of the subject pixel $B_{46}$ and another color are added for generating magenta Mg. More specifically, the flag "+" is indicative of the addition of all pixels surrounding the subject pixel $B_{46}$. Thereafter, the subroutine SUB8 ends by determining that high-frequency luminance data $Y_H$ for the subject pixel $B_{46}$ has been calculated. By the procedure described above, Mg pixel data are generated at the positions of the colors R and B in addition to the G real pixels, which are derived from the shot, as shown in FIG. 12. Because the G and Mg pixel data can be dealt with as high-frequency luminance data $Y_H$, high-frequency luminance data $Y_H$ are generated at the positions of all real pixels shown in FIG. 13.

Figure 14:
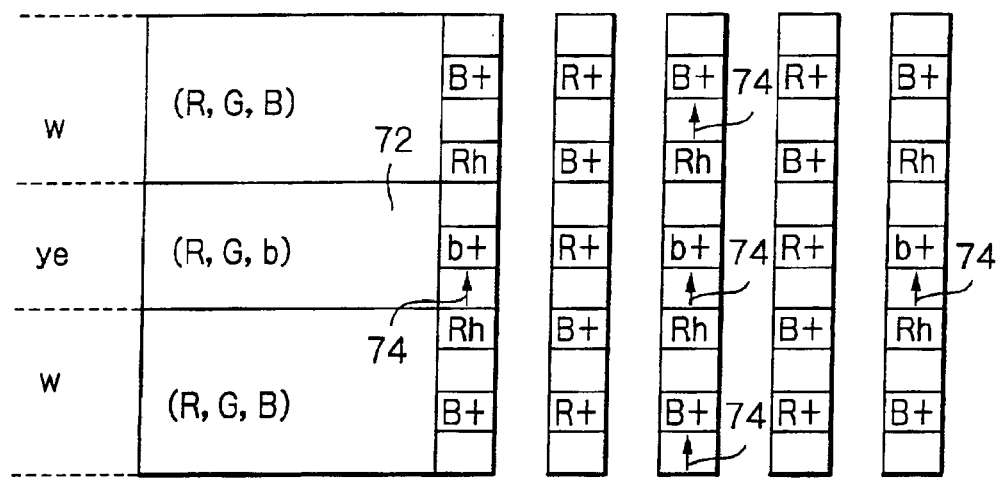
FIG. 14 shows colors and signal levels derived from pixels at the time of a shot together with flags indicative of directions of high-frequency luminance data generated by a conventional algorithm.

Luminance sometimes appears on a subject in an elongate pattern having a particular width, as stated earlier. In such a case, a difference in luminance level occurs in the direction of length. For example, as shown in FIG. 14, a difference in luminance level occurs in a position where a yellow (ye) portion 72 is sandwiched between two white (w) portions; the color G is not shown. In each white portion, image data of, e.g., three primary colors R, G and B are produced with substantially the same level. The yellow portion 72 (b+, R+, b+, R+, b+) is represented by, e.g., R and G pixel data of substantially the same level and B pixel data of a lower level b. As the flag "+" indicates, high-frequency luminance data for the yellow portion 72 are produced from a mean value of four pixels around the subject pixel. Assuming that high-frequency luminance data for the pixels R+ and b+ are $Y_H(R+)$ and $Y_H(b+)$, respectively, then the luminance data $Y_H(R+)$ and $Y_H(b+)$ are expressed as:

$$Y_H(R+)=R/2+(B+b+B+b)=R/2+(B+b)/4 \qquad \text{Eq. (6a)}$$

$$Y_H(R+)=b/2+(R+R+R+R)/8=R/2+R/2 \qquad \text{Eq. (6b)}$$

A difference $)Y_H$ in level between the high-frequency luminance data $Y_H(R+)$ and $Y_H(b+)$ is produced by:

$$)Y_H=Y_H(R+)-Y_H(b+)=(B-b)/4 \qquad \text{Eq. (7)}$$

The difference $)Y_H$ is causative of irregularity.

Figure 15:
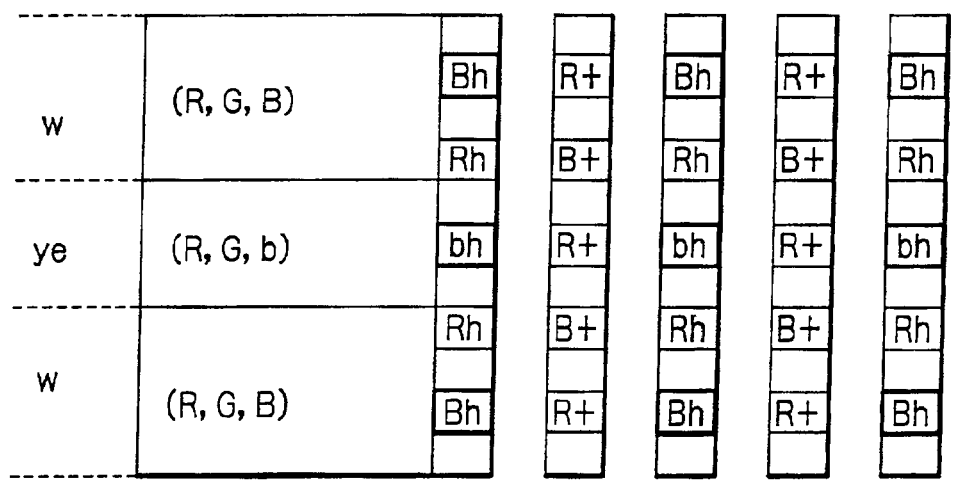
FIG. 15 shows portions of FIG. 14 corrected by vertical/horizontal correlation decision processing that is added to the procedure of FIG. 11.

To solve the above problem, the illustrative embodiment additionally executes vertical/horizontal correlation decision processing with respect to the area 70, FIG. 6. This decision processing uses pixels of the same color including the subject pixel. Specifically, in FIG. 14, the pixel data designated by arrows 74 are used. The arrows 74 show that the substep SS818 and successive substeps shown in FIG. 11B have executed correlation decisions with B pixels, which are indicated by bold frames in FIG. 15, by replacing the flag "+" with the flag "h". In this manner, one frame of high-frequency luminance data $Y_H$ is calculated. Subsequently, the flag pattern of the one frame of high-frequency luminance data is compared and corrected (substep SS36, FIG. 8).

Figure 16:
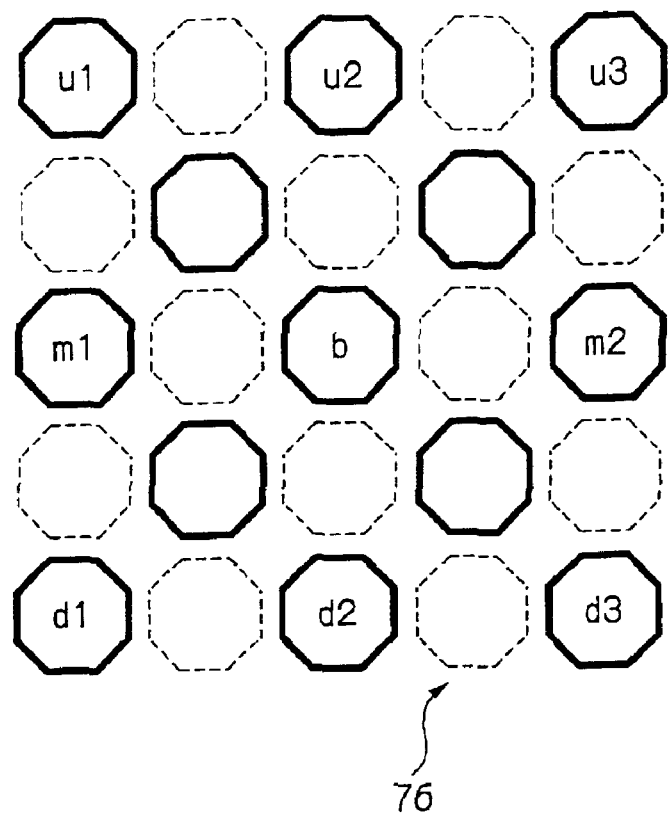
FIG. 16 shows a positional relation between pixels used for the comparison and correction of flag patterns shown in FIG. 8.

For the comparison and correction, thirteen real pixels including the subject pixels are used. Specifically, the thirteen real pixels shown in FIG. 16 lie in a region 76 and consist of pixels u1, u2 and u3 at the top row, pixels m1 and m2 at the medium row, and pixels d1, d2 and d3 at the bottom row. Whether or not to correct the flag of each of the R and B positions is determined by using eight pixels surrounding the subject pixel to be compared and corrected.

Figure 17:
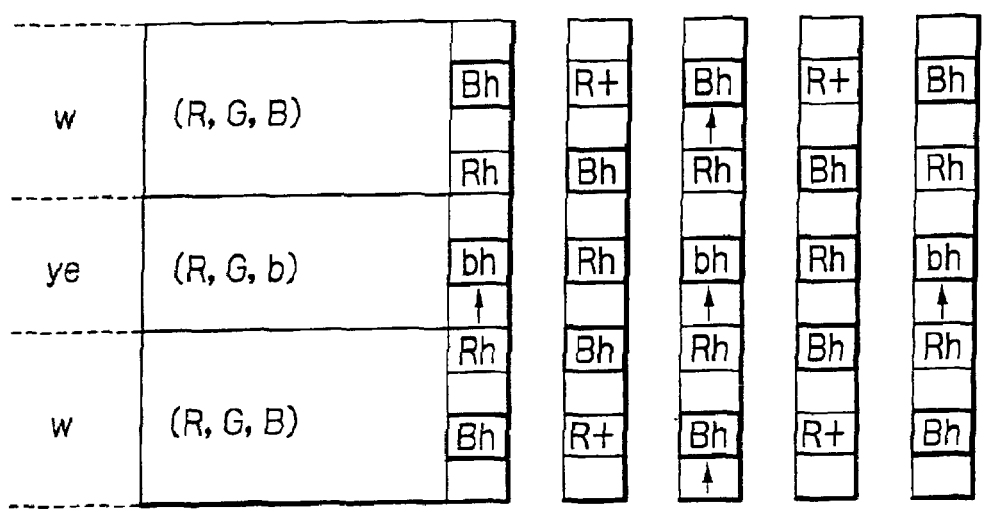
FIG. 17 shows the result of comparison and correction.

More specifically, if the flags of the pixels at the top and bottom rows are identical or if the flags of the pixels at the right and left columns are identical, then the flag of the subject pixel is replaced with the flag of such surrounding pixels. For example, assume that the flags of the pixels u1, u2 and u3 and those of the pixels d1, d2 and d3 all are "h" indicative of a horizontal correlation, or that the flags of the pixels u1, m1 and d1 and those of the pixels u3, m2 and d3 all are "h". Then, the flag of the subject pixel b is replaced with the flag "h". This will be understood even more specifically from a color $B_h$ shown in FIG. 17. High-frequency luminance data $Y_H$ based on a horizontal correlation is calculated at the same time as the correction of the flag.

On the other hand, assume that the flags of the pixels u1, u2 and u3 and those of the pixels d1, d2 and d3 or the flags of the pixels u1, m1 and d1 and those of the flags u3, m2 and d3 all are "v" indicative of a vertical correlation. Then, the flag of the subject pixel b is replaced with the flag "v". At the same time, high-frequency luminance data $Y_H$ based on a vertical correlation is calculated. This is successful to obviate the difference $)Y_H$ in luminance level.

Figure 18:
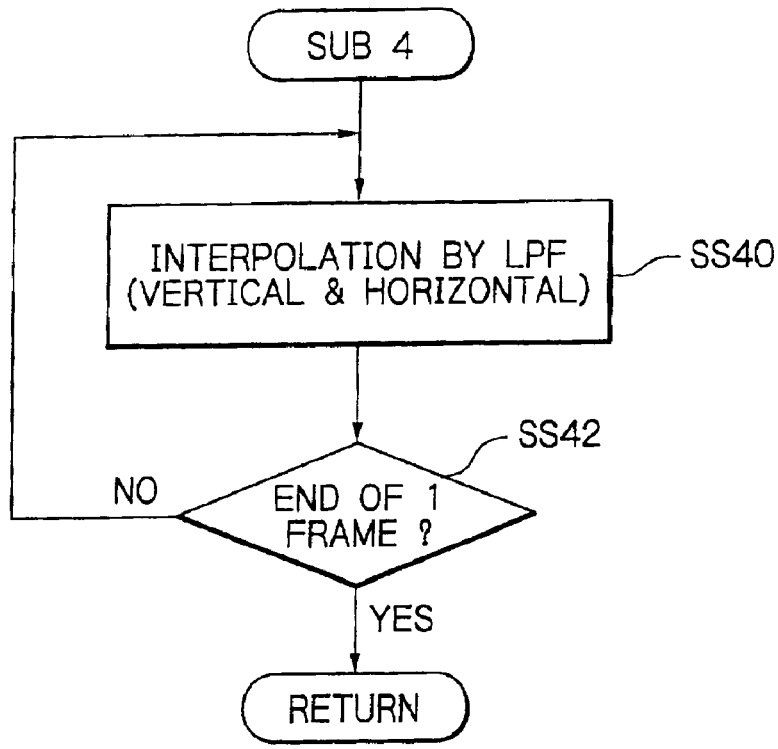
FIG. 18 shows a flowchart useful for understanding a subroutine included in the subroutine of FIG. 7 for executing luminance interpolation.
Figure 19:
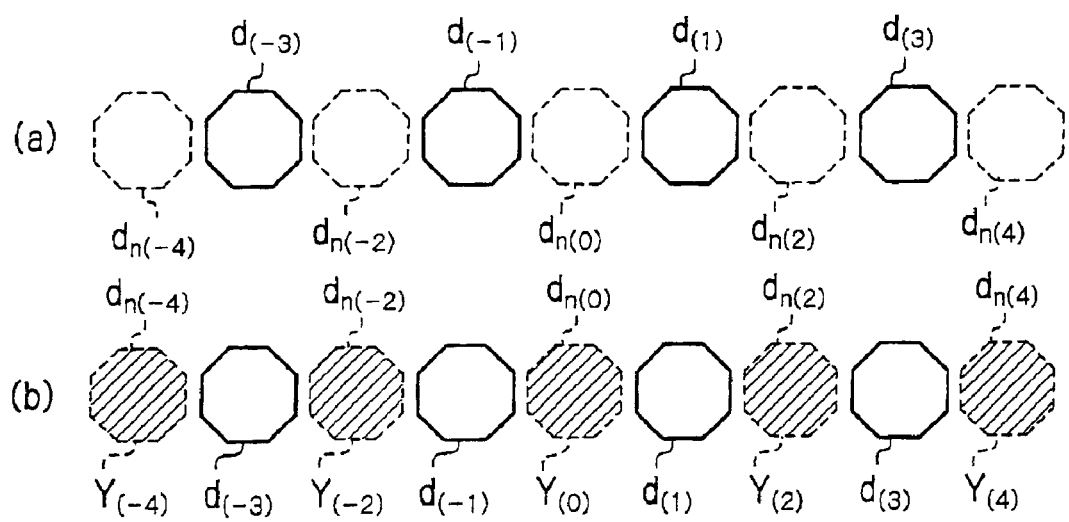
FIG. 19 shows a diagram useful for understanding the principle of LPF (Low-Pass Filter) processing applicable to the subroutine of FIG. 18.

The subroutine SUB4 for the interpolation of luminance data will be described in detail with reference to FIG. 18. As shown, high-frequency luminance data $Y_H$ for virtual pixels are generated on the basis of the high-frequency luminance data $Y_H$ generated at the positions shown in FIG. 13 (substep SS40). The interpolation is executed vertically and horizontally for each virtual pixel. FIG. 19 demonstrates LPF processing that may be used for the vertical and horizontal interpolation. The LPF processing will be briefly described hereinafter.

As shown in FIG. 19, part (a), real pixels $d_{(-3)}$, $d_{(-1)}$, $d_{(-1)}$ and $d_{(3)}$ indicated by solid lines and virtual pixels $d_{n(-4)}$, $d_{(-2)}$, $d_{n(0)}$, $d_{n(2)}$ and $d_{n(4)}$ indicated by phantom lines alternate with each other. The virtual pixels $d_{n(-4)}$, $d_{n(-2)}$, $d_{n(0)}$, $d_{n(2)}$ and $d_{n(4)}$ may be dealt with as pixels storing no data in consideration of their correspondence to the real pixels. More specifically, (logical) ZEROs are filled in the virtual pixels beforehand. For example, assume that the virtual pixel $d_{n(0)}$ is to be interpolated in the horizontal direction, and that a digital filter has tap coefficients of $k_0$, $k_1$, $k_2$, $k_3$, $k_4$, ..., $k_n$. Then, high-frequency luminance data $Y_{H(0)}$ is expressed as:

$$Y_{H(0)} = k_0 * d_{n(0)} + k_1 * (d_{(1)} + d_{(-1)}) + k_2 * (d_{n(-2)} + d_{n(2)}) + \quad \text{Eq. (8)}$$
$$k_3 * (d_{(-3)} + d_{(3)}) + k_4 * (d_{n(-4)} + d_{n(4)}) + \ldots$$
$$k_n * (d_{n(-n)} + d_{n(n)})$$

As FIG. 19, part (a), indicates, the tap coefficients are doubled because of the ZERO data alternating with the real pixels. This relation applies to the other virtual pixels $d_{n(-4)}$, $d_{n(-2)}$, $d_{n(2)}$ and $d_{n(4)}$ as well. Consequently, as shown in FIG. 19, part (b), high-frequency luminance data $Y_{H(-4)}$, $Y_{H(-2)}$, $Y_{H(2)}$ and $Y_{H(4)}$ are generated for the virtual pixels $d_{n(-4)}$, $d_{n(-2)}$, $d_{n(2)}$ and $d_{n(4)}$, respectively.

Figure 20:
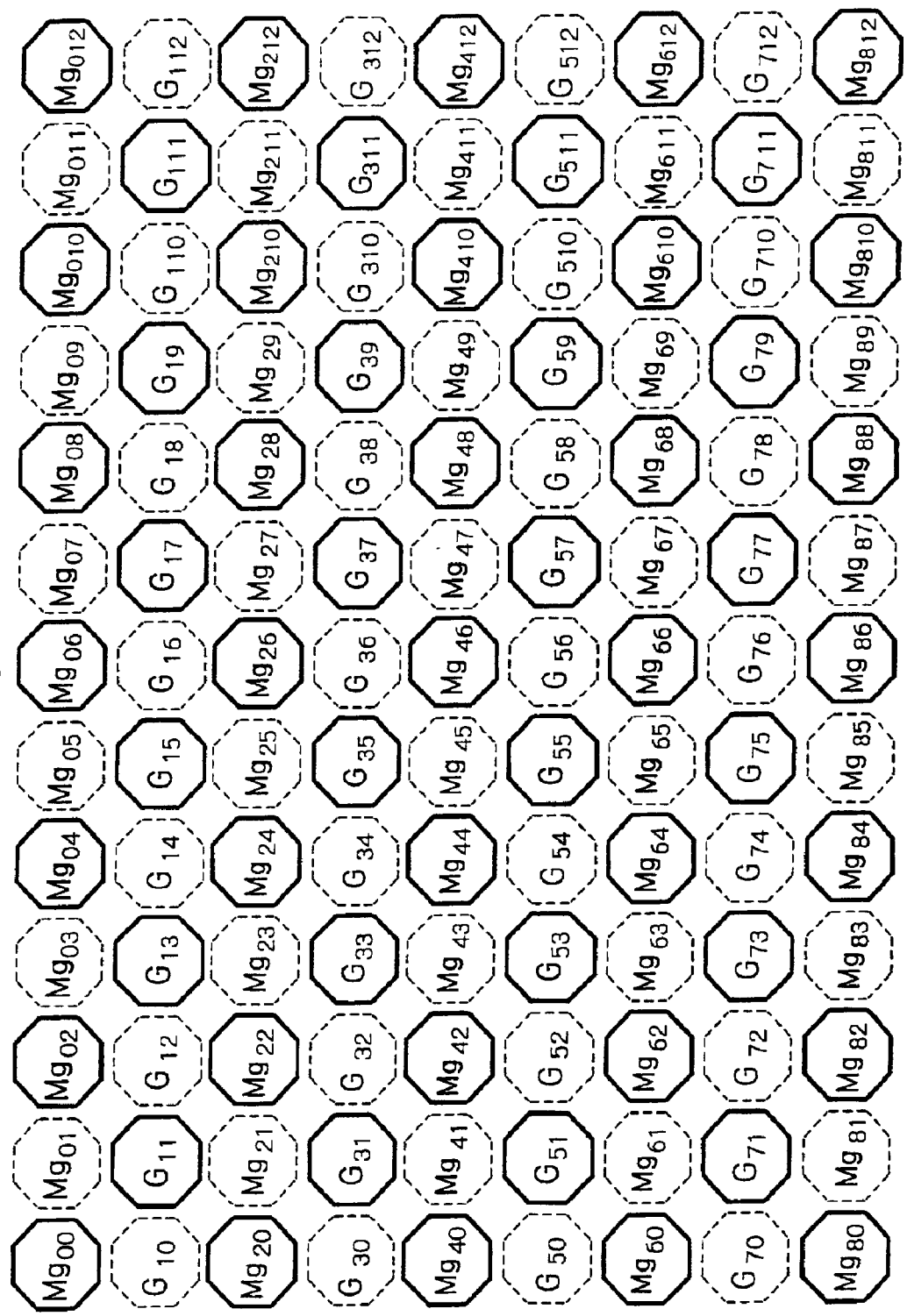
FIG. 20 shows an interpolated pattern produced by horizontal interpolation forming part of the LPF processing of FIG. 19.
Figure 21:
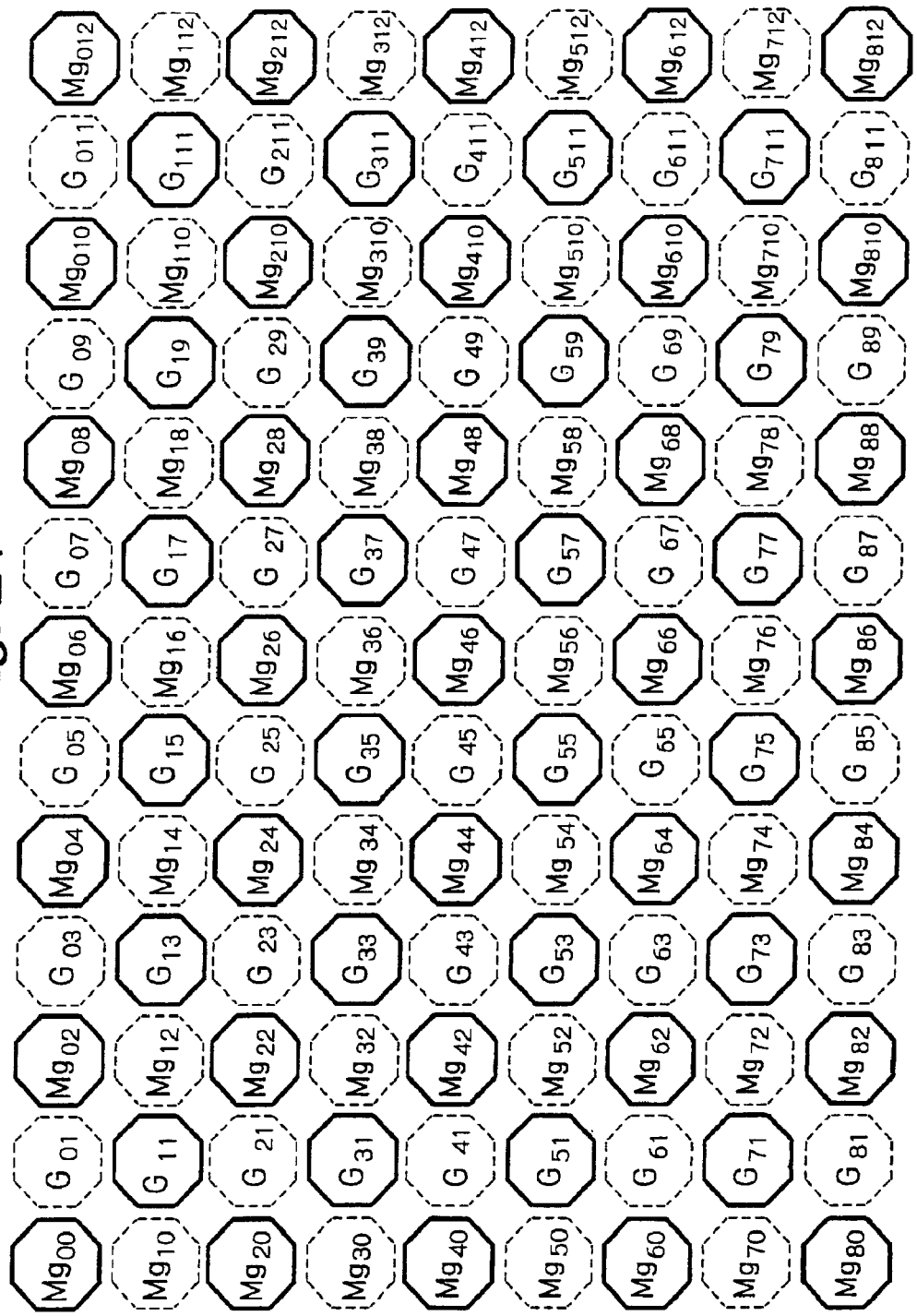
FIG. 21 shows an interpolated pattern produced by vertical interpolation forming the other part of the LPF processing of FIG. 19.

After the substep SS40, whether or not high-frequency luminance data have been interpolated in virtual pixels over the entire frame is determined (substep SS42). If the answer of the substep SS42 is NO, then the procedure returns to the substep SS40. If the answer of the substep SS42 is YES, then the procedure returns by determining that the interpolation of high-frequency luminance data has completed. FIG. 20 shows the high-frequency luminance data $Y_H$ generated for the real pixels and virtual pixels and represented by the colors G and Mg in particular rows. The LPF processing is executed in the vertical direction as well. As a result, as shown in FIG. 21, the colors G and Mg each are generated in particular columns.

The LPF processing described above maybe replaced with vertical and horizontal interpolation taking account of a correlation between a subject pixel and real pixels surrounding it. If desired, extra processing for canceling either one of a horizontal frequency band and a vertical frequency band that overlap each other may be executed with the high-frequency luminance data $Y_H$.

Figure 22:
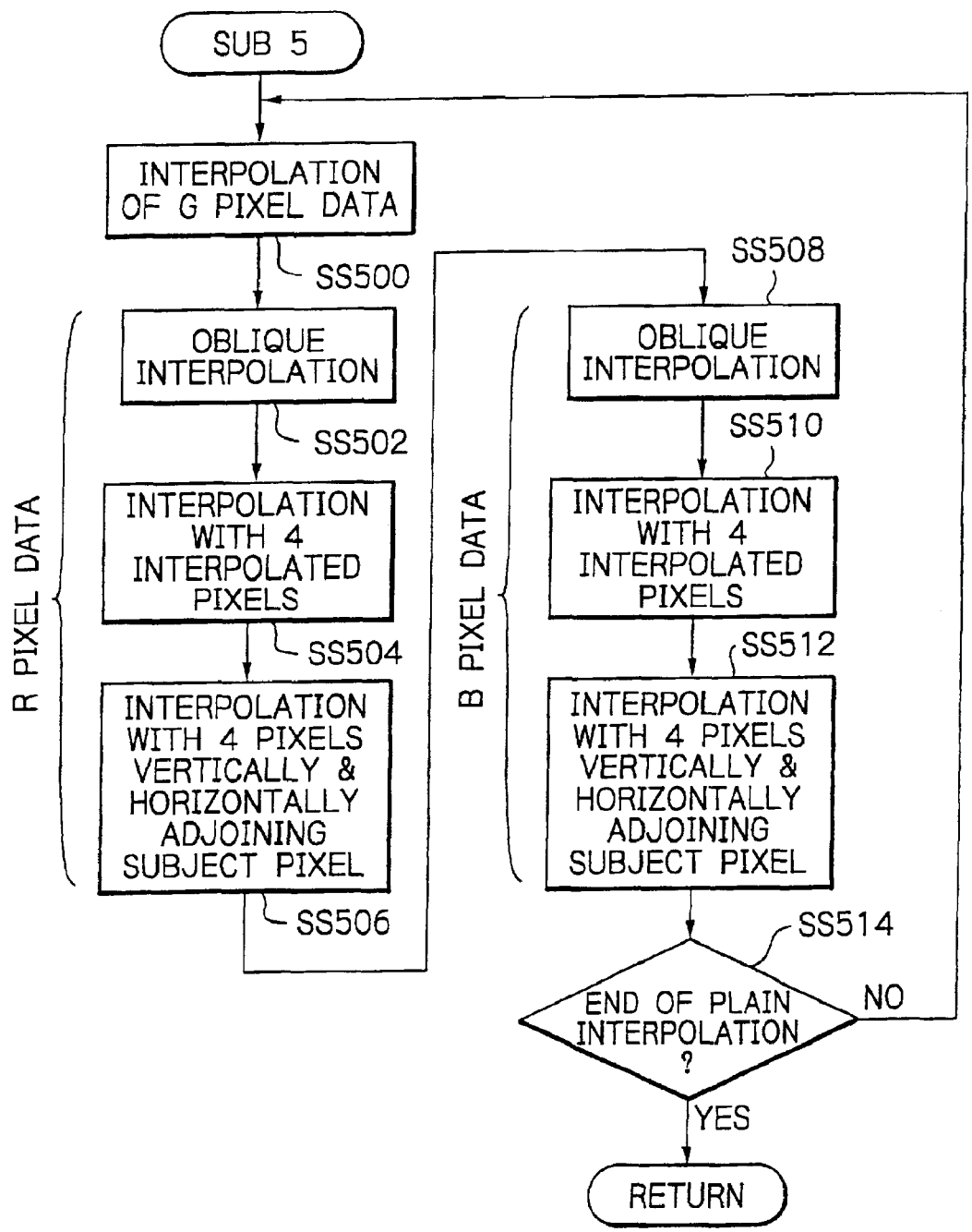
FIG. 22 shows a flowchart useful for explaining procedures of a subroutine included in the subroutine of FIG. 7 for executing color interpolation.

Reference will be made to FIG. 22 for describing the color interpolation (subroutine SUB5) in detail. The color interpolation is assigned to the color interpolating circuit 42, FIG. 3. The R, G and B data 38 read out of the data corrector 30a are input to the R interpolator 420, G interpolator 422 and B interpolator 424, respectively. Pixel data for real pixels and virtual pixels are generated color by color on the basis of the above pixel data.

Specifically, as shown in FIG. 22, G pixel data are interpolated in a substep SS500 first. Because use is made of the honeycomb type G square lattice, RB full-checker pattern shown in FIG. 6, real pixels storing existing G pixel data are represented by solid octagons. On the other hand, pixels not storing G pixel data, i.e., virtual pixels and pixels storing pixel data other than G pixel data are represented by phantom octagons. Let the pixels not storing G pixel data be also referred to as virtual pixels. For the interpolation, each four existing pixel data are used.

FIG. 20 shows the above relation more specifically. As shown, assume a row one half of which is occupied by real G pixels and the other half of which is occupied by virtual pixels $G_{12}$, $G_{44}$, $G_{16}$, $G_{18}$, $G_{110}$ and $G_{112}$, and a row next to the above row and not including the color G at all. Then, to interpolate G pixel data in, e.g., a pixel $G_{22}$, four pixel data $G_{11}$, $G_{13}$, $G_{31}$ and $G_{33}$ adjoining the pixel $G_{22}$ are used. Likewise, to interpolate G pixel data in a pixel $G_{24}$, four pixel data $G_{13}$, $G_{15}$, G33 and $G_{35}$ are used. For example, G pixel data G21 to be interpolated in a subject virtual pixel is produced from the data of two real pixels belonging to the same column as the pixel $G_{21}$:

$$G_{21}=(G_{11}+G_{31})/2 \quad \text{Eq. (9)}$$

By applying the pixel data $G_{13}$ and $G_{33}$ to the Eq. (9), it is possible to interpolate G pixel data in the virtual pixel $G_{23}$. As for the virtual pixel $G_{12}$, the data of two real pixels $G_{11}$ and $G_{13}$ belonging to the same row as the pixel $G_{12}$ are used to interpolate G pixel data produced by:

$$G_{12}=(G_{11}+G_{13})/2 \quad \text{Eq. (10)}$$

To interpolate G pixel data in the virtual pixel $G_{32}$, the pixel data $G_{31}$, and $G_{33}$ are applied to the Eq. (10). As for a pixel data $G_{22}$ located surrounded by the four pixel data $G_{11}$, $G_{13}$, $G_{31}$ and $G_{33}$, G pixel data is interpolated by using the four pixel data:

$$G_{22}=(G_{11}+G_{13}+G_{31}+G_{33})/4 \quad \text{Eq. (11)}$$

By applying the pixel data $G_{13}$, $G_{15}$, $G_{33}$ and $G_{35}$ surrounding the virtual pixel $G_{24}$ to the Eq. (11), it is possible to interpolate G pixel data in the virtual pixel $G_{24}$. Because the pixel data $G_{23}$ has already been calculated, the pixel data $G_{14}$ and pixel data $G_{34}$ and $G_{25}$ can be calculated in the same manner as described above. Such interpolation using real pixels is repeated to generate a plain picture including only the G pixel data. The above relation does not hold at the outermost edges of the plain picture. In light of this, a boundary value may be set beforehand in order to enhance strict interpolation. Data at the peripheral portion of a plain picture may not be calculated at all because such data do not lie in a valid screen range, if desired.

The substep SS500 is followed by a substep SS502 for calculating R pixel data. As shown in FIG. 6, real R pixel data appear only every other column, i.e., $R_{00}$, $R_{04}$, $R_{08}$, $R_{012}$, $R_{22}$, $R_{26}$, $R_{210}$, $R_{40}$, $R_{44}$, $R_{46}$ and so forth. In this case, interpolation is implemented by two pixel data obliquely adjoining a subject, virtual pixel. For example, the pixel data of pixels $R_{00}$ and $R_{22}$ are used to generate R pixel data to be interpolated in a virtual pixel $R_{11}$:

$$R_{11}=(R_{00}+R_{22})/2 \quad \text{Eq. (12)}$$

Likewise, by applying pixel data $R_{40}$ and $R_{22}$ to the Eq. (12), it is possible to generate R pixel data to be interpolated in a virtual pixel $R_{31}$. Further, pixel data $R_{44}$ and $R_{22}$ are applied to the Eq. (12) for generating R pixel data to be interpolated in a virtual pixel $R_{33}$. Even R pixel data for virtual pixels $R_{15}$ and $R_{35}$ can be calculated by such oblique interpolation if consideration is given to the existing pixel data $R_{26}$ as well.

Subsequently, the four pixels calculated by the immediately preceding step are used to interpolate R pixel data in a pixel surrounded by the four pixels (substep SS504). For example, as FIG. 6 indicates, the pixel data $R_{13}$, $R_{15}$, $R_{33}$ and $R_{35}$ are used to calculate R pixel data for a virtual pixel $R_{24}$:

$$R_{24}=(R_{13}+R_{15}+R_{33}+R_{35})/4 \qquad \text{Eq. (13)}$$

In the same manner, R pixel data $R_{02}$, $R_{20}$ and $R_{42}$ can be calculated by interpolation because the relation represented by the Eq. (13) holds between the surrounding pixels. Stated another way, all the pixel data to be used for interpolation obliquely adjoin a subject pixel.

After the step SS504, interpolation is effected by using, among the pixel data interpolated by the above sequence of steps, four pixel data vertically and horizontally adjoining a subject pixel (substep SS506). For example, four pixel data $R_{02}$, $R_{11}$, $R_{13}$ and $R_{22}$ positioned at the left and right of and above and below the pixel data $R_{12}$ are used to calculate R pixel data:

$$R_{12}=(R_{02}+R_{11}+R_{13}+R_{22})/4 \qquad \text{Eq. (14)}$$

To calculate pixel data $R_{14}$, $R_{23}$, $R_{25}$, $R_{34}$ and so forth to which the above-described positional relation applies, corresponding surrounding pixel data R are substituted for the Eq. (14). Virtual pixels at the peripheral portion of a picture remain non-interpolated. Such virtual pixels each may be interpolated by use of three pixels adjoining it. For example, pixel data $R_{01}$ is produced from three adjoining pixels $R_{00}$ and $R_{02}$ and $R_{11}$:

$$R_{01}=(R_{00}+R_{02}+R_{11})/3 \qquad \text{Eq. (15)}$$

Pixel data $R_{03}$, $R_{05}$, $R_{10}$, $R_{30}$, $R_{41}$, $R_{43}$ and $R_{45}$ each are interpolated in the same manner as the pixel data $R_{01}$. By the procedure described above, a plane picture relating to the pixel data R is completed.

After the substep SS506, the interpolation of B pixel data is executed (substeps SS508, SS510 and SS512). The interpolation of B pixel data also includes oblique interpolation, center interpolation using four interpolated data, and center interpolation using four vertically and horizontally adjoining pixels. The substeps SS508 through SS512 are similar to the substeps SS502 through SS506, as will be seen from the positional relation between the R pixel data and the B pixel data. Specifically, as the suffixes attached to the colors indicate, the B pixel data are arranged in a pattern in which the R pixel data are sequentially shifted in the horizontal direction (direction of row) by each two columns. To calculate B pixel data to be interpolated in virtual pixels, "2" is added to the suffix representative of a position in a matrix and attached to each of the pixel with the suffix of 2 and successive pixels. By executing interpolation by taking account of such a relation, it is possible to complete a plain picture relating to the pixel data B.

After the substep SS512, whether or not plain pictures of all colors have been completed is determined (substep SS514). If the answer of the substep SS512 is NO, then the procedure returns to the substep SS500. This decision may be made color by color, if desired. If the answer of the substep SS512 is YES, then the subroutine SUB5 ends.

Figure 23:
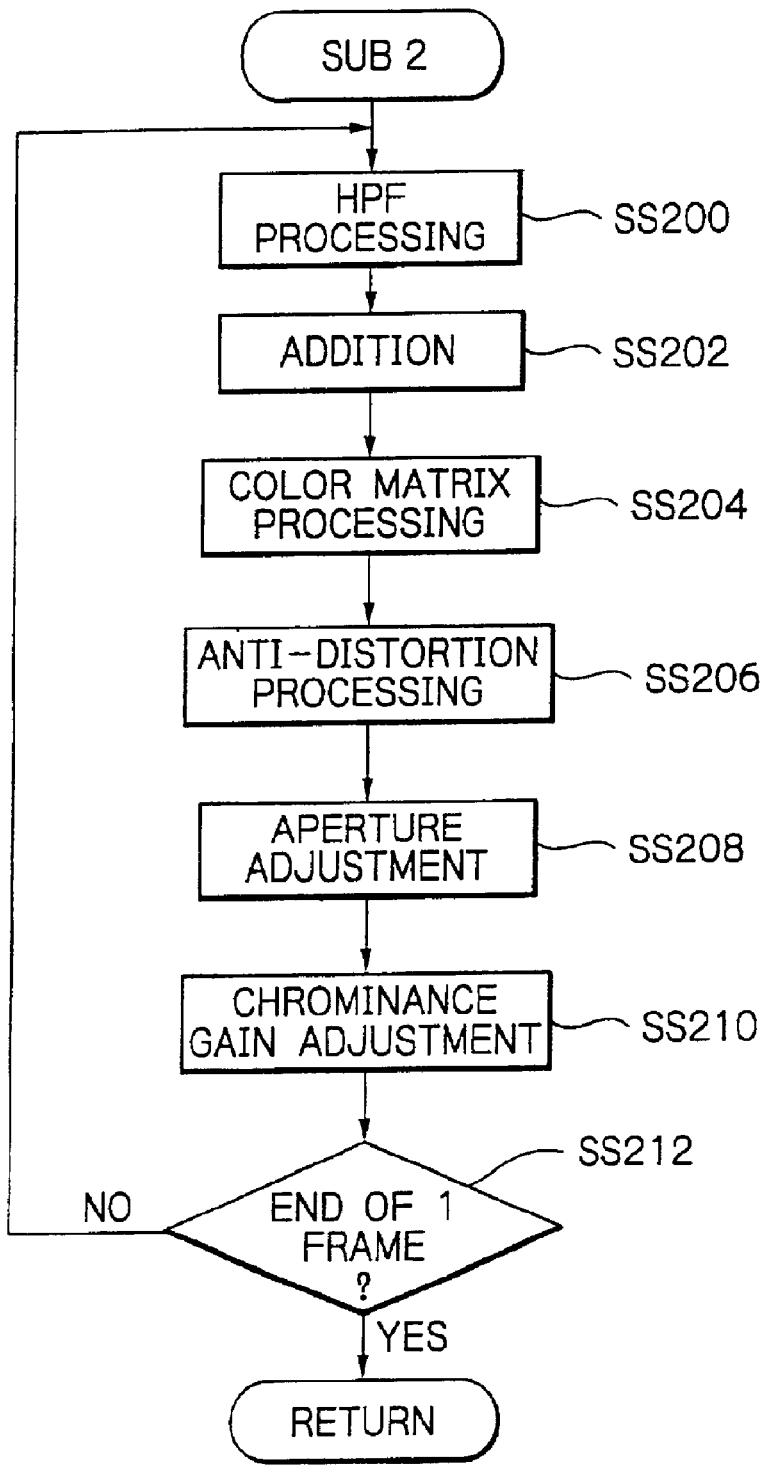
FIG. 23 shows a flowchart useful for understanding a subroutine included in the main routine of FIG. 5 for broadening frequency bands for a still picture.

Reference will be made to FIG. 23 for describing the band broadening processing. As shown, HPF processing is executed with the high-frequency luminance data $Y_H$ (44) in order to pass frequencies higher than a preselected frequency (substep SS200). As a result, high-frequency components $Y_h$ included in the high-frequency luminance data are separated as a signal. The high-frequency components $Y_h$ are input to the addition circuit 54, FIG. 4, made up of the R, G and B adders 540, 542 and 544. More specifically, the R, G and B adders 540, 542 and 544 respectively receive the plain, R pixel data (46), G pixel data (48) and B pixel data (50) at one end 540a, 542a and 544a. Also, the adders 540 through 544 receive the high-frequency components $Y_h$ corresponding to the above R, G and B pixel data at the other ends 540b, 542b and 544b.

The addition circuit 54 adds the high frequency components $Y_h$ and R, G and B pixel data pixel by pixel (substep SS202). Generally, the R, G and B pixel data have their frequency bands broadened with the individual pixel being represented by a matrix position (i, j). The band broadening operation will be represented by a suffix H hereinafter. Pixel data $R_{Hij}$, $G_{Hij}$ and $B_{Hij}$ with broadened frequency bands are expressed as:

$$R_{Hij}=R_{ij}+Y_{hij} \qquad \text{Eq. (16a)}$$

$$G_{Hij}=G_{ij}+Y_{hij} \qquad \text{Eq. (16b)}$$

$$B_{Hij}=B_{ij}+Y_{hij} \qquad \text{Eq. (16c)}$$

The pixel data $R_{Hij}$, $G_{Hij}$ and $B_{Hij}$ are input to the color matrix 56. The color matrix 56 executes luminance and chrominance of matrix calculation with the pixel data $R_{Hij}$, $G_{Hij}$ and $B_{Hij}$ at the positions of the real pixels and virtual pixels (substep SS204). As a result, luminance data Y and chrominance data $C_r$ and $C_b$ with broadened frequency bands are generated.

The luminance data Y and chrominance data $C_r$ and $C_b$ are fed to the anti-distortion circuit 58. The anti-distortion circuit 58 executes anti-distortion processing with the luminance data Y and chrominance data $C_r$ and $C_b$ (substep SS206). Specifically, the circuit 58 passes the luminance signal Y and chrominance signal $C_r$ and $C_b$ extended in frequency while executing LPF processing for obviating aliasing distortion. Further, the circuit 58 limits either one of a horizontal and a vertical frequency band overlapping each other, thereby protecting image quality from degradation ascribable to overlapping frequencies.

The luminance data Y subjected to the anti-distortion processing is input to the aperture adjuster 60. The aperture adjuster 60 executes aperture adjustment, which corresponds to contour enhancement, with the luminance data Y (substep SS208). On the other hand, the chrominance data $C_r$ and $C_b$ subjected to the anti-distortion processing are input to the chrominance gain adjusters 62 and 64, respectively. The chrominance gain adjusters 62 and 64 respectively adjust the gains of the chrominance data $C_r$ and $C_b$ (substep SS210)

After the step SS210, whether or not one frame has been fully processed is determined (substep SS212). If the answer of the substep SS212 is NO, then the procedure returns to the substep SS200, if otherwise, the substep SUB2 ends.

The procedure described above successfully enhances accurate correlation processing and thereby insures high image quality. For example, even when a scene including yellow thin lines sandwiched between white portions are picked up, steps that would degrade image quality do not appear in the thin lines.

Thin lines with steps are apt to appear even in cases other than one stated above. For example, steps appear when the distance between thin lines lying in a dark portion sandwiched between light portions is relatively great or relatively small. As for steps to appear when the above distance is great, FIG. 24 shows flags obtained in up to the substep SS816 of the subroutine SUB8.

In FIG. 24, capital letters indicate pixel data with a high signal level while small letters indicate pixel data with a low signal level. As shown, the colors R, G and B in light portions sandwiching a dark portion have a high signal level; R and B pixel data between the G pixel data each are the mean of four surrounding pixels. The R and B pixel data closest to the dark portion show that a horizontal correlation exists. In the dark portion, r and b pixels between g pixels each are the mean of four surrounding pixels. High-frequency luminance data $Y_H$ (r+) and $Y_H$ (b+) corresponding to the r and b pixels, respectively, are produced by:

$$Y_H(r+) = r/2 + (B+b+B+b)/8 \quad \text{Eq. (17a)}$$
$$= r/2 + (B+b)/4$$

$$Y_H(b+) = b/2 + (R+r+R+r)/8 \quad \text{Eq. (17b)}$$
$$= b/2 + (R+r)/4$$

As for a difference in level between luminance data in the direction of length, a difference $)Y_H$ in level between the high-frequency luminance data $Y_H$ (R+) and $Y_H$ (b+) is expressed as:

$$Y_H = Y_H(r+) - Y_H(b+) = (R-R+B-b)/4 \quad \text{Eq. (18)}$$

Assume that the substeps SS818 through SS824 are executed in consideration of the above situation. Then, the flag "+" attached to the pixel data derived from a mean of four surrounding pixels each and sandwiched between the colors G and g is determined to have a horizontal correlation and therefore replaced with the flag "h". The pixel data to which the flag "h" is attached in place of the flag "+" are indicated by bold frames in FIG. 24. When the pixel data with the flag "h" are used to calculate high-frequency luminance data $Y_H$, the difference in level represented by the Eq. (18) becomes zero. The flags attached to the pixel data R, B, r and b are related in the same manner as the pixel data G and g, so that the comparison or the correction of the flag patterns is not necessary.

Figures 26, 27, 28:
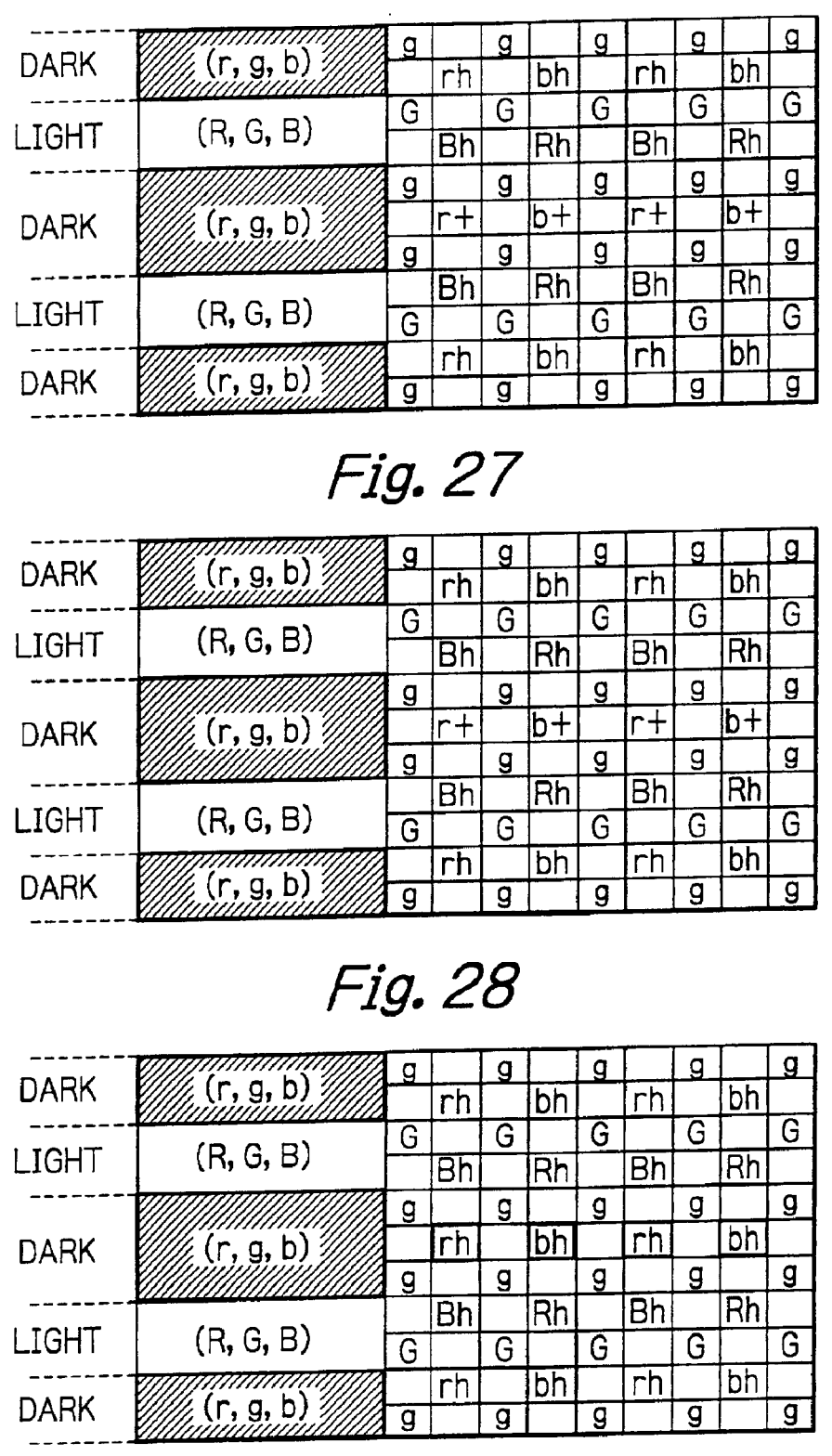

As shown in FIG. 26, in the case where the distance between thin lines is relatively small, the pixels r and b between the light portions each are determined to be a mean of four surrounding pixels, as indicated by the flag "+". In this case, high-frequency luminance data $Y_H$ (r+) and $Y_H$ (b+) are produced by the Eqs. (17a) and (17b) respectively, so that a difference in level $)Y_H$ is produced by the Eq. (18). The substeps SS818 through 824 are so executed as to obviate the above difference in level. However, as for the flags attached to the pixels r and b, such processing directed toward correlation accuracy cannot improve the situation shown in FIG. 26 at all (see FIG. 27).

In light of the above, in the illustrative embodiment, the comparison and correction of flag patterns is executed after the adaptive processing (substep SS36). Specifically, the pixel data B and R overlying and underlying the subject pixels are provided with the flag "h" each. Therefore, the flag "+" attached to the subject pixels is replaced with the flag "h". By generating high-frequency luminance data $Y_H$ in accordance with the correction of the flag, it is possible to obviate a difference in level between the high-frequency luminance data $Y_H$ of the pixels indicated by bold frames in FIG. 28. In this manner, the illustrative embodiment generates high-frequency luminance data $Y_H$ without any difference in level and thereby insures high image quality.

Figure 29:
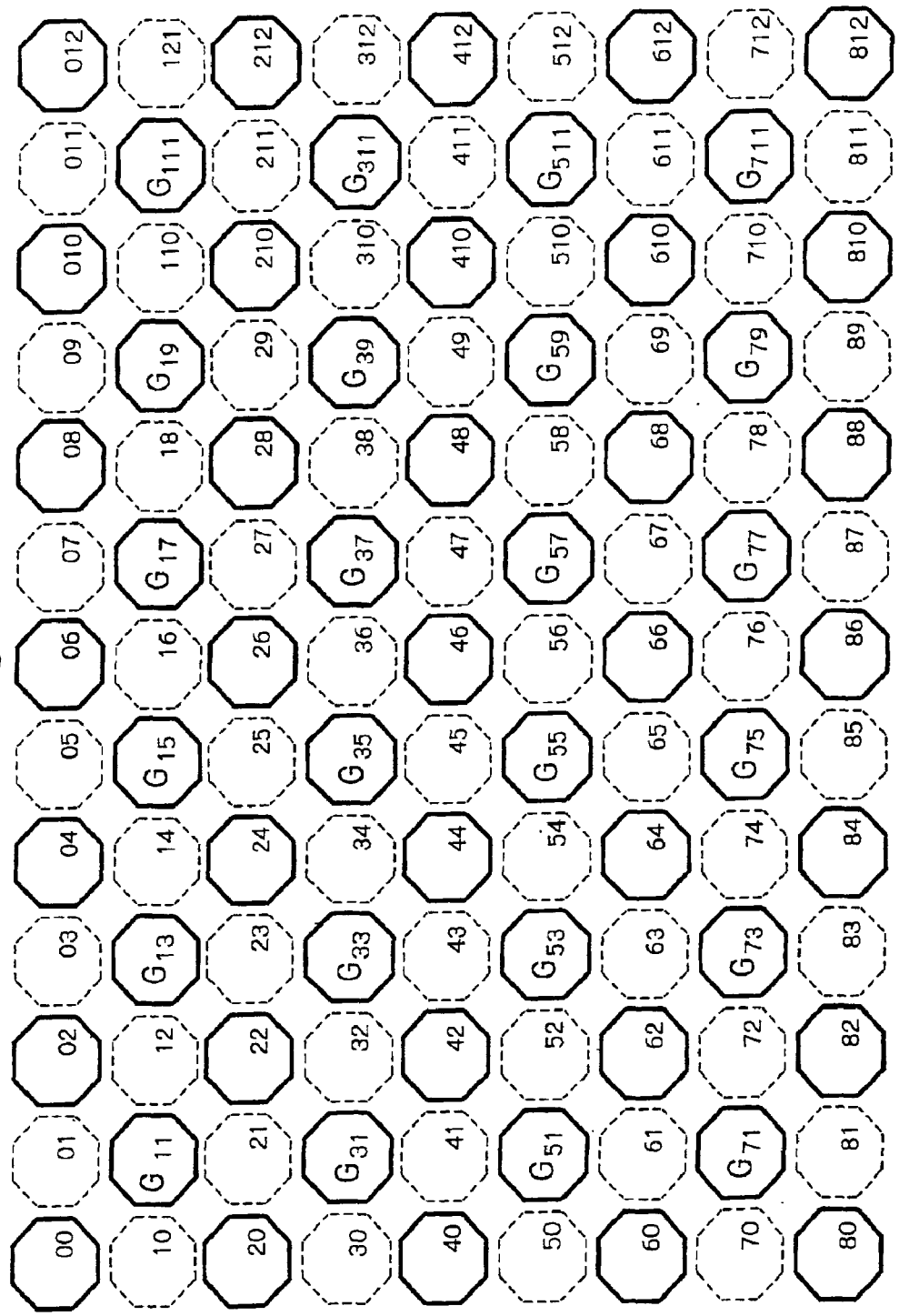
FIG. 29 shows a pixel pattern paying attention to green.
Figure 30:
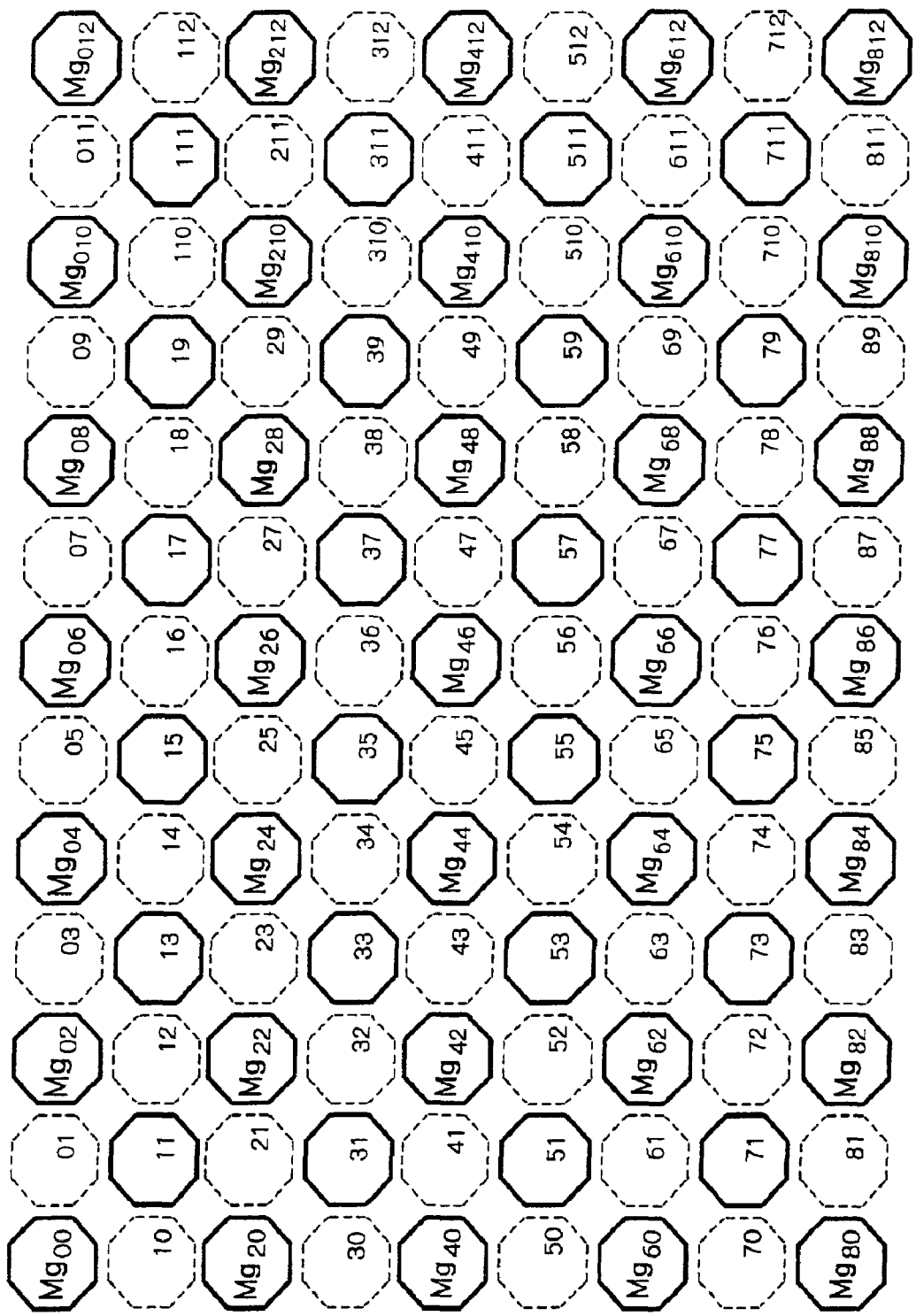
FIG. 30 shows a pixel pattern paying attention to magenta.
Figure 31:
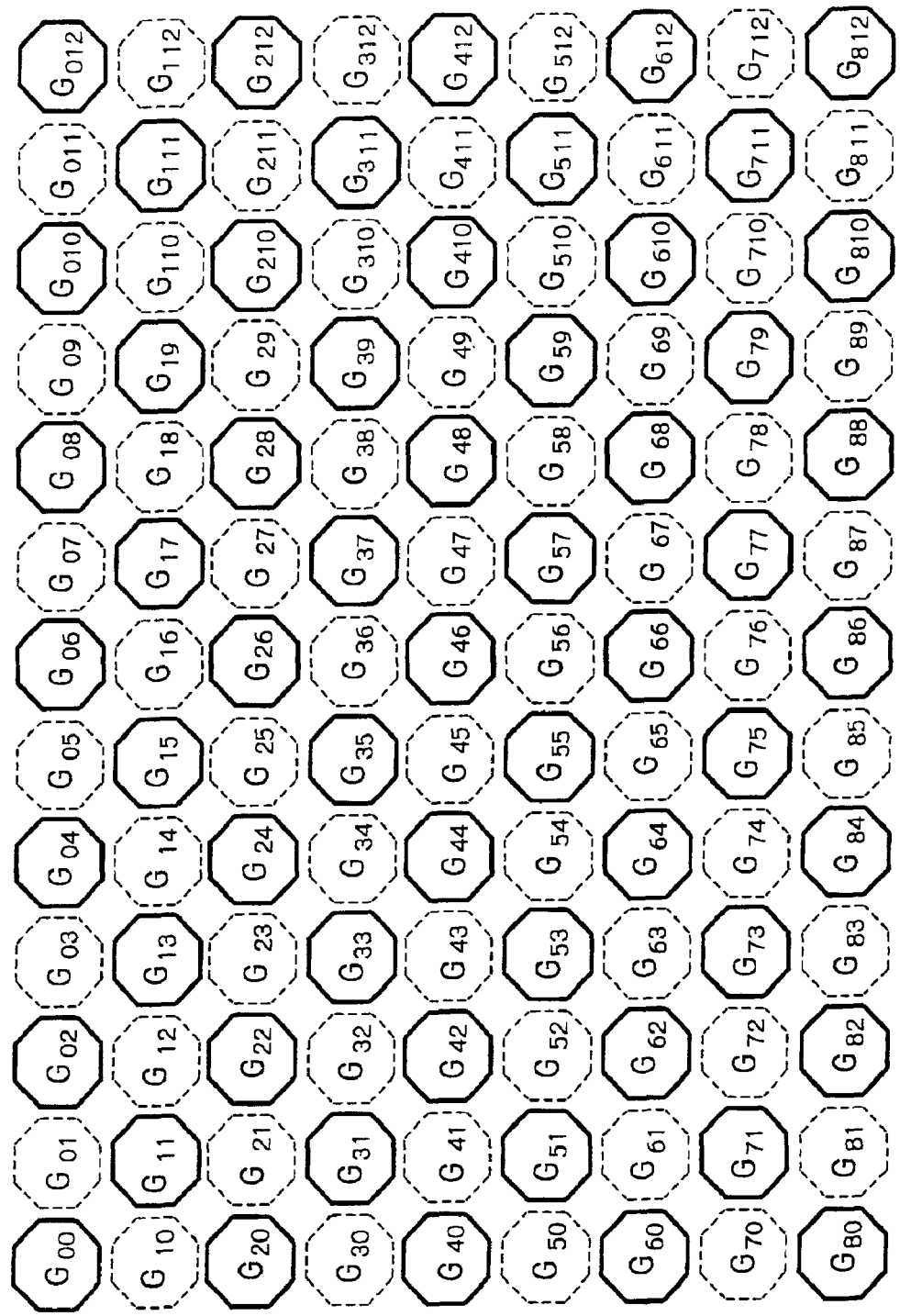
FIG. 31 shows a plain picture resulting from the interpolation of green.
Figure 32:
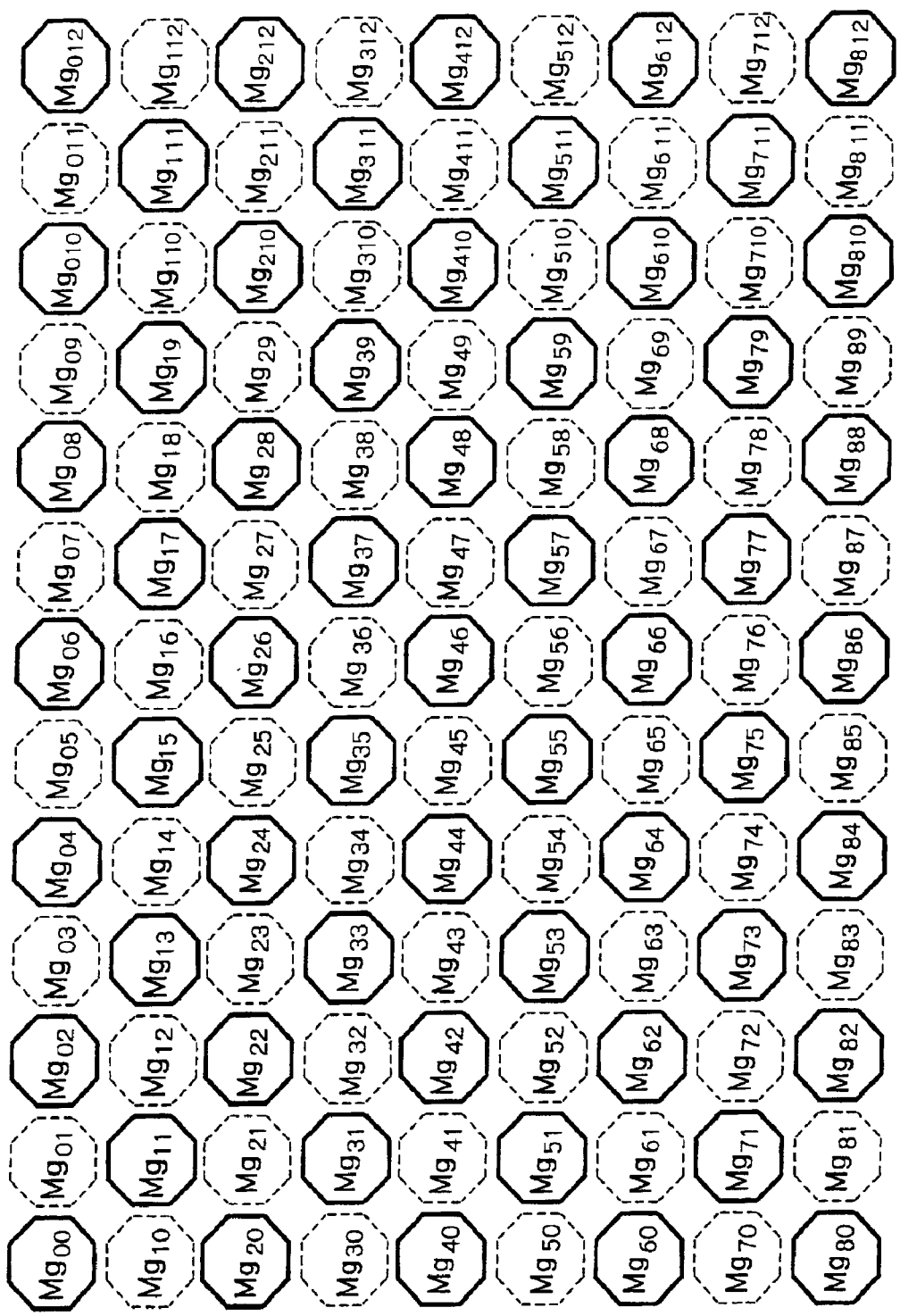
FIG. 32 shows a plain picture resulting from the interpolation of magenta.

The illustrative embodiment generates high-frequency luminance data $Y_H$ over the entire frame by executing interpolation with the colors G and Mg in the horizontal and vertical directions, as stated above. Alternatively, the interpolation may be executed by paying attention to each of the colors G and Mg. FIGS. 29 and 30 respectively show a pattern containing only the color G and a pattern containing only the color Mg. FIGS. 31 and 32 respectively show plain, G pixel data and plain, Mg pixel data produced by the interpolation of the patterns shown in FIGS. 29 and 30. Further, as for the interpolation of luminance, high-frequency luminance data $Y_H$ may be implemented by data produced by adding corresponding plain, G and Mg pixels.

As stated above, assuming, e.g., a chromatic or achromatic elongate subject, the illustrative embodiment detects a correlation between a subject pixel and pixels of the same color as the subject pixel over a broad range. The illustrative embodiment can therefore obviate a difference in luminance level in the direction of length. Further, the illustrative embodiment enhances correlation accuracy by considering the pattern of flags indicative of the kind of a correlation each. This successfully obviates spurious signals intersecting the wedge shaped portion of a resolution chart and obviates discontinuous straight lines as well as other defects.

In summary, in accordance with the present invention, green pixel data read out are regarded as luminance data and used as they are. Decision processing for enhancing correlation accuracy is executed with a subject pixel. For example, whether or not a subject pixel and pixels of the same color as the subject pixel are correlated is determined over a broad range; in this case, correction is executed that takes account of the pattern of flags indicative of the kind of a correlation each. A plurality of other pixel data around the subject pixel positioned in the direction of correlation are used to generate pixel data of a color complementary to green. More specifically, assume that one of a red and a blue real pixel is a subject pixel. Then, magenta pixel data, which is complementary to green, is generated by executing addition with the red pixel by taking account of blue surrounding it or executing addition with the blue pixel by taking account of red surrounding it. The magenta pixel data is also regarded as luminance data. This obviates, when a subject including chromatic or achromatic thin lines is picked up, a difference in level between the luminance data of pixels adjoining each other in the direction of length. Such pixel data is used to interpolate a virtual pixel by use of pixel data of the same color as the subject pixel and adjoining the subject pixel in the vertical or the horizontal direction. At the same time, a frequency band in the direction perpendicular to the direction used for the above interpolation is limited in order to protect image quality from degradation. The present invention can therefore obviate spurious signals intersecting the wedge-shaped portion of a resolution chart and can obviate discontinuous straight lines as well as other defects.

The entire disclosure of Japanese patent application No. 2000-390121 filed on Dec. 22, 2000, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. An image signal processing method using a plurality of photosensitive cells, each of which is shifted from a geometric center of an adjoining photosensitive cell by half a pitch in at least one of a direction of row and a direction of column for separating incident light representative of a scene into three primary colors and executing photoelectric transduction with separated light, using said plurality of photosensitive cells as real pixels, converting image signals output from said plurality of photo sensitive cells to digital image data, and executing, by using said digital image data, interpolation for generating virtual pixels between said real pixels to thereby generate luminance data and chrominance data, said image signal processing method comprising:

a first step of obtaining, when the image data are bidimensionally arranged such that green of the image data appears in a square lattice pattern, red pixel data from the real pixels facing each other in one diagonal direction at both sides of green, and obtaining blue pixel data from the real pixels facing each other in the other diagonal direction at both sides of green;

a second step of generating, when either one of a red real pixel and a blue real pixel is a subject pixel to be dealt with, pixel data of a complementary color complementary to green by using a plurality of pixel data surrounding said subject pixel and positioned in a direction of correlation, while making a decision for improving correlation accuracy;

a third step of generating pixel data to be interpolated in a virtual pixel from pixel data of a same color facing each other in at least one of a horizontal direction and a vertical direction by using the pixel data of the complementary color and the green pixel data; and a fourth step of limiting a frequency band in a direction perpendicular to a direction used for interpolation.

2. The method in accordance with claim 1, wherein said second step comprises a fifth step of making a decision on a horizontal/vertical correlation by using pixel data identical in color with the subject pixel and adjoining said subject pixel in the horizontal direction and the vertical direction.

3. The method in accordance with claim 2, wherein said fifth step produces, before the decision, an absolute value of a difference between pixel data identical in color with the subject pixel and adjoining said subject pixel at a left-hand side in the horizontal direction and said subject pixel as a first horizontal difference absolute value, produces an absolute value of a difference between pixel data identical in color with said subject pixel and adjoining said subject pixel at a right-hand side in the horizontal direction and said subject pixel as a second horizontal difference absolute value, produces a sum of said first horizontal difference absolute value and said second horizontal difference absolute value as horizontal comparison data, produces an absolute value of a difference between pixel data identical in color with said subject pixel and positioned vertically above said subject pixel as a first vertical difference absolute value, produces an absolute value of a difference between pixel data identical in color with said subject pixel and positioned vertically below said subject pixel as a second vertical difference absolute value, and produces a sum of said first vertical difference absolute value and said second vertical difference absolute value as vertical comparison data;

said fifth step comprising:

a first decision step of determining that a vertical correlation exists if a difference produced by subtracting said vertical comparison data from said horizontal comparison data is greater than or equal to a preselected value;

a second decision step of determining that a horizontal correlation exists if a difference produced by subtracting said horizontal comparison data from said vertical comparison data is greater than or equal to a preselected value; and a third decision step of determining that a correlation does not exist in a case other than said first decision step and said second decision step.

4. The method in accordance with claim 3, further comprising:

a sixth step of producing, when a correlation exists as determined by said first decision step or said second decision step, a mean of a pair of pixel data different in color from the subject pixel data and adjoining said subject pixel data in a direction of said correlation, multiplying each of said mean and said subject pixel data by a half weighting coefficient, and producing a sum of resulting products; and a seventh step of producing, when a correction does not exist, a mean of pixel data surrounding the subject pixel data, but different in color from the subject pixel data, multiplying each of the subject pixel data and said mean by a half weighting coefficient, and producing a sum of resulting products.

5. The method in accordance with claim 3, wherein said second step comprises:

an eighth step of determining, after the decision on the real pixel and by using a flag, a direction in which, among red pixel data or blue pixel data surrounding the subject pixel, but different in color from said subject pixel, pixel data vertically or horizontally facing each other with the intermediary of said subject pixel are correlated;

a ninth step of determining, if the pixel data compared are correlated in a same direction, that the subject pixel is also correlated in said direction, correcting said subject pixel, producing, in accordance with a result of correction, a mean of the subject pixel data and a pair of pixel data adjoining said subject pixel data in said direction, but different in color from said subject pixel data, multiplying each of said mean and said subject pixel data by a half weighting coefficient, and producing a sum of resulting products; and a tenth step of using, when even a single pixel data differs in the direction of correlation, a correlation assigned to the subject pixel.

6. The method in accordance with claim 5, wherein said ninth step determines that the subject pixel has a correlation identical in direction with one of correlations of the surrounding pixels having a highest degree, produces, in accordance with a result of determination, a mean of the subject pixel data and a pair of pixel data adjoining said subject pixel data in the direction of correlation, but different in color from said subject pixel data, multiplies each of said mean and said subject pixel data by a half weighting coefficient, and produces a sum of resulting products.

7. The method in accordance with claim 1, wherein said third step comprises inserting preselected data in the virtual pixels beforehand and then executing LPF (Low-Pass Filter) processing in at least one of the vertical direction and the horizontal direction.

8. The method in accordance with claim 2, wherein said third step comprises inserting preselected data in the virtual pixels beforehand and then executing LPF (Low-Pass Filter) processing in at least one of the vertical direction and the horizontal direction.

9. The method in accordance with claim 3, wherein said third step comprises inserting preselected data in the virtual pixels beforehand and then executing LPF (Low-Pass Filter) processing in at least one of the vertical direction and the horizontal direction.

10. The method in accordance with claim 4, wherein said third step comprises inserting preselected data in the virtual pixels beforehand and then executing LPF (Low-Pass Filter)

processing in at least one of the vertical direction and the horizontal direction.

11. The method in accordance with claim 5, wherein said third step comprises inserting preselected data in the virtual pixels beforehand and then executing LPF (Low-Pass Filter) processing in at least one of the vertical direction and the horizontal direction.

12. The method in accordance with claim 6, wherein said third step comprises inserting preselected data in the virtual pixels beforehand and then executing LPF (Low-Pass Filter) processing in at least one of the vertical direction and the horizontal direction.

13. An image signal processing method using a plurality of photosensitive cells, each of which is shifted from a geometric center of an adjoining photosensitive cell by half a pitch in at least one of a direction of row and a direction of column for separating incident light representative of a scene into three primary colors and executing photoelectric transduction with separated light, using said plurality of photosensitive cells as real pixels, converting image signals output from said plurality of photosensitive cell to digital image data, and executing, by using said digital image data, interpolation for generating virtual pixels between said real pixels to thereby generate luminance data and chrominance data, said image signal processing method comprising:

a first step of obtaining, when the image data are bidimensionally arranged such that green of image data appears in a square lattice pattern, red pixel data from the real pixels facing each other in one diagonal direction at both sides of green of said image data, and obtaining blue pixel data from the real pixels facing each other in the other diagonal direction at both sides of green;

a second step of generating a green picture while executing interpolation with the virtual pixels by using the green pixel data output;

a third step of generating, when either one of a red real pixel and a blue real pixel is a subject pixel to be dealt with, pixel data of a complementary color complementary to green by using a plurality of pixel data different in color from said subject pixel surrounding said subject pixel and positioned in a direction of correlation while making a decision for improving correlation accuracy, and executing interpolation with a virtual pixel by using the pixel data of the complementary color to thereby generate a complementary color picture;

a fourth step of adding said green picture and said complementary color picture to thereby produce sum pixel data; and a fifth step of limiting either one of a horizontal frequency band and a vertical frequency band of said sum pixel data.

14. The method in accordance with claim 13, wherein said third step comprises a sixth step of making a decision on a horizontal/vertical correlation by using pixel data identical in color with the subject pixel and adjoining said subject pixel in the horizontal direction and the vertical direction.

15. The method in accordance with claim 14, wherein said sixth step produces, before the decision, an absolute value of a difference between pixel data identical in color with the subject pixel and adjoining said subject pixel at a left-hand side in the horizontal direction and said subject pixel as a first horizontal difference absolute value, produces an absolute value of a difference between pixel data identical in color with said subject pixel and adjoining said subject pixel at a right-hand side in the horizontal direction and said subject pixel as a second horizontal difference absolute value, produces a sum of said first horizontal difference absolute value and said second horizontal difference absolute value as horizontal comparison data, produces an absolute value of a difference between pixel data identical in color with said subject pixel and positioned vertically above said subject pixel as a first vertical difference absolute value, produces an absolute value of a difference between pixel data identical in color with said subject pixel and positioned vertically below said subject pixel as a second vertical difference absolute value, and produces a sum of said first vertical difference absolute value and said second vertical difference absolute value as vertical comparison data;

said sixth step comprising:

a first decision step of determining that a vertical correlation exists if a difference produced by subtracting said vertical comparison data from said horizontal comparison data is greater than or equal to a preselected value;

a second decision step of determining that a horizontal correlation exists if a difference produced by subtracting said horizontal comparison data from said vertical comparison data is greater than or equal to a preselected value; and a third decision step of determining that a correlation does not exist in a case other than said first decision step and said second decision step.

16. The method in accordance with claim 15, further comprising:

a seventh step of producing, when a correlation exists as determined by said first decision step or said second decision step, a mean of a pair of pixel data identical in color with the subject pixel data and adjoining said subject pixel data in a direction of said correlation, multiplying each of said mean and the subject pixel data by a half weighting coefficient, and producing a sum of resulting products; and an eighth step of producing, when a correction does not exist, a mean of pixel data surrounding the pixel data, but different in color from said pixel data, multiplying each of said subject pixel data and said mean by a half weighting coefficient, and producing a sum of resulting products.

17. The method in accordance with claim 15, wherein said third step comprises:

a ninth step of determining, after the decision on the real pixel and by using a flag, a direction in which, among red pixel data or blue pixel data surrounding the subject pixel, but different in color from said subject pixel, pixel data vertically or horizontally facing each other at both sides of said subject pixel are correlated;

a tenth step of determining, if the pixel data compared are correlated in a same direction, that the subject pixel is also correlated in said direction, correcting said subject pixel, producing, in accordance with a result of correction, a mean of the subject pixel data and a pair of pixel data adjoining said subject pixel data in said direction, but different in color from said subject pixel data, multiplying each of said mean and said subject pixel data by a half weighting coefficient, and producing a sum of resulting products; and an eleventh step of using, when even a single pixel data differs in the direction of correlation, a correlation assigned to the subject pixel.

18. The method in accordance with claim 17, wherein said eleventh step determines that the subject pixel has a correlation identical in direction with one of correlations of the surrounding pixels having a highest degree, produces, in accordance with a result of determination, a mean of the subject pixel data and a pair of pixel data adjoining said subject pixel data in the direction of correlation, but different in color from said subject pixel data, multiplies each of said mean and said subject pixel data by a half weighting coefficient, and produces a sum of resulting products.

19. The method in accordance with claim 13, wherein the interpolation of the virtual pixels comprises executing LPF processing with said virtual pixels after insertion of preselected data in said virtual pixels or generating green and the color complementary to green in accordance with a result of decision on the correlation of the pixel data surrounding said virtual pixels.

* * * * *

UNITED STATES PATENT AND TRADEMARK OFFICE
CERTIFICATE OF CORRECTION

PATENT NO.    : 6,897,425 B2
DATED         : May 24, 2005
INVENTOR(S)   : Masaru Osada It is certified that error appears in the above-identified patent and that said Letters Patent is hereby corrected as shown below:

<u>Title page,</u>
Item [30], Foreign Application Priority Data, please replace with the following:
-- Dec. 22, 2000          (JP) ………………….. 2000-390121 --.

Signed and Sealed this

Sixth Day of September, 2005

JON W. DUDAS
*Director of the United States Patent and Trademark Office*